United States Patent [19]

Pagany

[11] 4,301,470
[45] Nov. 17, 1981

[54] ALIGNMENT APPARATUS

[75] Inventor: Volker Pagany, Freising, Fed. Rep. of Germany

[73] Assignee: Texas Instruments Deutschland, Freising, Fed. Rep. of Germany

[21] Appl. No.: 130,646

[22] Filed: Mar. 17, 1980

[30] Foreign Application Priority Data

Mar. 17, 1979 [DE] Fed. Rep. of Germany ....... 2910580

[51] Int. Cl.³ .............................................. H04N 7/00
[52] U.S. Cl. ................................... 358/101; 356/400; 364/559
[58] Field of Search ................. 358/101; 364/559, 474; 356/400

[56] References Cited

U.S. PATENT DOCUMENTS

| 3,899,634 | 8/1975 | Montone et al. | 358/101 |
| 4,203,132 | 5/1980 | Schmitt et al. | 358/101 |
| 4,212,031 | 7/1980 | Schmitt et al. | 358/101 |

Primary Examiner—Jin F. Ng
Assistant Examiner—Edward L. Coles
Attorney, Agent, or Firm—N. Rhys Merrett; Melvin Sharp; Gary Honeycutt

[57] ABSTRACT

A matrix array of semiconductor bars is located on an X-Y table and the bars are successively brought into the field of view of a television camera for precise alignment with respect to a reference point. The video signals corresponding to an image of the bar and its peripheral area are digitized to produce digitized video signals predominantly of a first level corresponding to surface area of the bar and of a second level corresponding to the peripheral areas. The digitized video signals are analyzed in data window sets, there being one data window set associated with a single edge of the image of the object, for each of the X and Y directions, corresponding to separate regions of the video image having in the associated axial direction predetermined distances from each other and different distances from an associated edge of the image of the object. When the bar is properly aligned, digitized video signals of the first level are detected in a predetermined number, different from zero, of the data windows in each set during the analysis in a predetermined sense in the associated axial direction. If the bar is misaligned, a number of digitized video signals of the first level, different from the predetermined number, will be revealed by the said analysis of each data window set and this information can be used to adjust the position of the X-Y table to precisely align the bar.

26 Claims, 16 Drawing Figures

ALIGNMENT APPARATUS

The invention relates to an apparatus for an object with respect to a known reference position.

One such apparatus is disclosed and claimed in patent application Ser. No. 164,717 filed June 30, 1980 (which is a continuation of application Ser. No. 948,064 filed Nov. 29, 1978) by Friedrich Guth for Alignment and Recognition Apparatus, and which is assigned to the assignee of the present application. In the example of embodiment described in that patent application for each axial direction of the adjustment of the carrier two data window sets are provided which lie in pairs on either side of the object so that in the aligned position of the object no overlapping exists between the image of the object and the video image areas corresponding to the data windows whereas with misalignment, depending on the direction thereof, the video image areas of one or more data windows of the one or other data window set are overlapped by the image of the object. The number of the overlapped data window video image areas is then a measure of the magnitude of the misalignment and the data window set to which the overlapped data window video image areas belong indicates the direction of the misalignment.

On the other hand, U.S. Pat. No. 3,899,634 discloses an alignment apparatus in which only one data window set is associated with each axial direction of the adjustment. In this known alignment apparatus the data window sets correspond to coherent area regions of the video image which extend in the vertical direction over several lines of the scanning raster and are arranged at two edges of the image of the object so that in the case of incorrect alignment there is overlapping with the image of the object. The digital video signals are analyzed in a plurality of successive scanning rasters and when video signals of the first signal value are detected in one data window set the carrier of the object, which is formed by an X-Y table, is adjusted in the direction in which the object is moved away from the video image area corresponding to the data window set. This operation is repeated until in the respective data window set no digital video signals of the first signal value are detected, which means that there is no longer any overlapping. The object is then aligned with the reference position. This known alignment apparatus operates on the principle of position control in the sense of eliminating an error signal. The alignment is thus effected in the course of a plurality of successive scanning rasters in each of which it is examined whether there is any overlapping, a further adjustment of the carrier being made if this is the case. The system is therefore relatively slow. It further requires that around each object there is a free space whose width corresponds to at least twice the alignment range so that with the largest misalignment occurring there is not yet any overlapping of an adjacent object with a video image region corresponding to a data window set. This known alignment apparatus is therefore not suitable for aligning objects which are disposed closely together with very small intermediate spaces on the carrier.

In contrast, in the alignment apparatus disclosed in elder patent application Ser. No. 948,064 the information indicated in the magnitude and direction of the misalignment is obtained during a single scanning of the line raster and the adjustment of the carrier is then carried out in a single operation in accordance with this information. This corresponds to the maximum alignment rate which can be achieved with a television scanning. The intermediate spaces between the images of the objects may be very much smaller than the width of the image areas corresponding to the data window sets and defining the alignment range because it is merely necessary for the image area corresponding to a single data window of the set to lie in an intermediate space. The image areas corresponding to the individual data windows within the set may be kept very narrow, for example with the width of a single television line. The maximum alignment range however corresponds to the number of data windows in each set and the alignment accuracy depends on the distance between the two data window image areas.

BRIEF SUMMARY OF THE INVENTION

The problem underlying the invention is to provide an alignment apparatus of the type indicated at the beginning which whilst retaining the aforementioned mode of operation and the resulting advantages results in a still simpler construction.

The present invention comprises an apparatus for aligning with respect to a known reference position an object disposed in a field of view of a television camera on a carrier adjustable in at least one axial direction, the television camera scanning a service of the object and a peripheral area surrounding the object in a line raster and generating electrical video signals which corresponds to an image of the scanned area, comprising digitizing means which receives the video signals and forms therefrom digital video signals of two signal levels which for the video signals originating from the object have predominantly a first signal level and for the video signals originating from the peripheral area having the second level, analyzing means for analyzing the digital video signals in at least one set of data windows which corresponds to separate regions of the video image having in an associated axial direction predetermined distances from each other and different distances from an associated edge of the image of the object when the latter is aligned with respect to said reference position, said analyzing means responding to the appearance of digital video signals of the first signal level in each data window and furnishing output signals for each data window set depending on the number of data windows counted in uninterrupted sequence in a predetermined sense in the associated axial direction, and during which the proportion of digital video signals of the first signal level exceeds a predetermined minimum value, wherein a single data window set is provided for each axial direction, and in each data window set the number of data windows counted in uninterrupted sequence in said predetermined sense in the respective axial direction and having a proportion of digital video signals of the first signal level exceeding said predetermined minimum value is equal to a predetermined number different from zero when said object is aligned with respect to said reference position.

The output signals may be used to operate control means for effecting displacement of the carrier by an amount and in a direction dependent upon the output signals.

In the alignment apparatus according to the invention the magnitude and direction of the alignment error is also determined by counting the data windows, which can be done during a single scanning of the line raster. However, only a single data window set is present for each scanning direction, reducing the expenditure on circuitry, in particular for the analyzing circuits. However, due to a special step the magnitude and direction of the alignment error can still be determined: The alignment position of the object corresponds to the case in which a predetermined number of the data window video image areas is overlapped by the image of the object and the remainder lies outside the image of the object. A deviation from the predetermined number of overlapped data window video image areas in the one or other direction then indicates directly the magnitude and direction of the necessary alignment correction.

Accordingly, the apparatus according to the invention is preferably so designed that the control means effects displacement of the carrier in each axial direction by an amount and in a direction corresponding to the difference between the predetermined number different from zero and and the number of data windows of the corresponding data window set counted in uninterrupted sequence in said predetermined sense in this axial direction and having a proportion of digital video signals of the first signal level exceeding the predetermined minimum value.

According to an advantageous embodiment of the invention the analyzing circuits may be so constructed that the output signals furnished by them indicate directly the amount and the sign of the difference between the predetermined number and the number of data windows counted.

A further advantage of the apparatus according to the invention resides in that it is not necessary to adapt the position of the data windows to the particular form and size of the objects to be aligned.

Further features and advantages of the invention will be apparent from the following description of an example of an embodiment thereof with the aid of the drawings, wherein:

DESCRIPTION OF THE PREFERRED EMBODIMENTS

Figure 1:
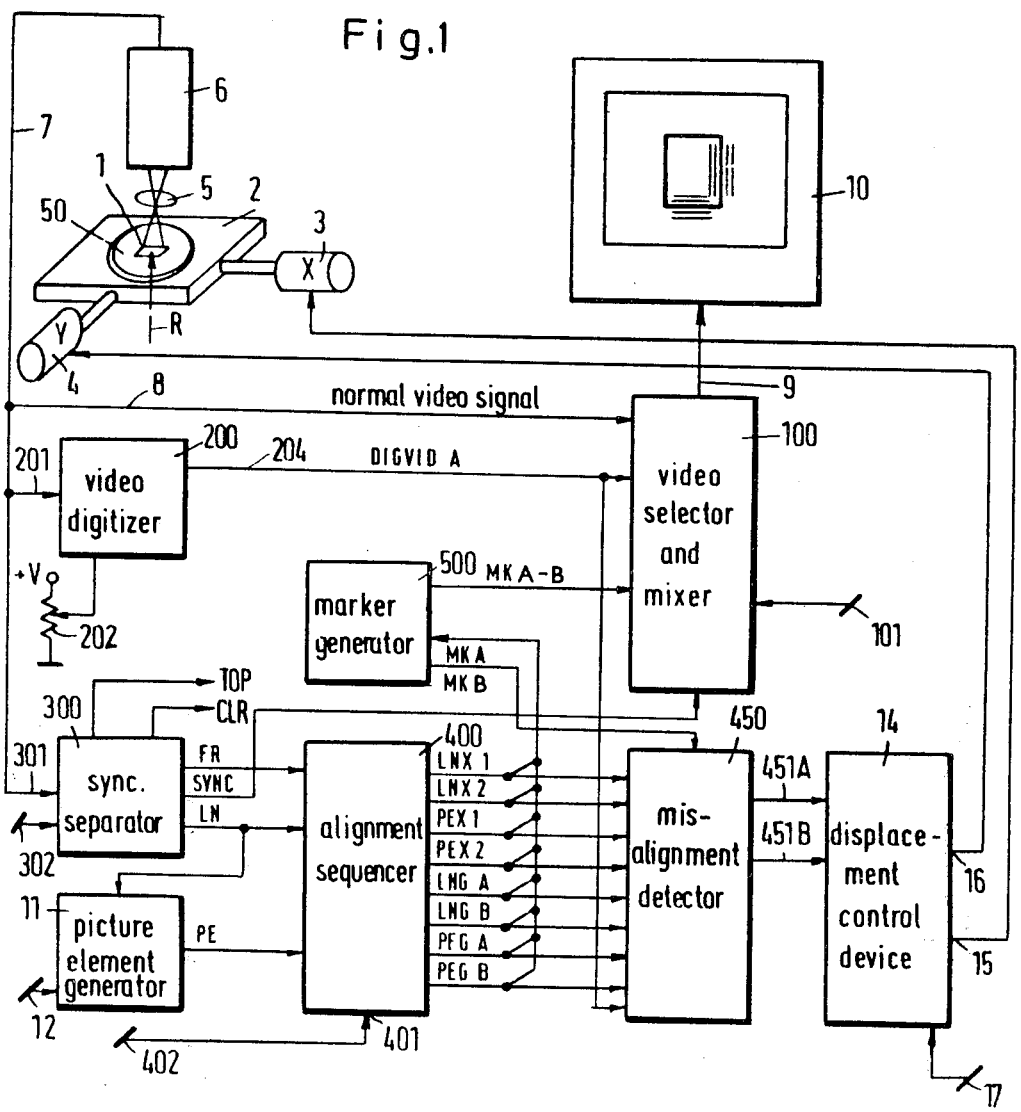
FIG. 1 is a block diagram of an alignment and recognition apparatus according to the invention.

The setting and alignment apparatus illustrated in FIG. 1 is intended to exactly align an object 1 in a horizontal plane with respect to a fixed reference point which is indicated by a vertical arrow R. For this purpose, the setting and alignment apparatus comprises an X-Y table 2 on the top of which the object 1 is placed and which is adjustable by two motors 3 and 4 in two directions perpendicular to each other, which are denoted as X-direction and Y-direction. The motors 3 and 4 are preferably electrical stepping motors which on each step effect an exactly defined adjustment of the X-Y table 2 in the associated direction, which is for example 10 $\mu$m. The stepping motor 3 is the X motor and the stepping motor 4 is the Y motor.

The object 1 may for example be a workpiece on which during the production certain manipulations must be made for which the exact alignment with the reference point R is necessary. Since generally the mass processing of very small workpieces with identical dimensions is involved, a relatively large number of these workpieces may be placed on the X-Y table 2 simultaneously and then aligned successively with the reference point R.

A preferred field of application of the setting and alignment apparatus is the fabrication of semiconductor devices. In the latter, it is of course usual to produce a great number of devices, such as transistors or integrated circuits, simultaneously on a single semiconductor slice of small thickness and then to separate said slice into individual elements which have the shape of rectangular wafers which are called "bars". A large number of such bars is then arranged for example in the manner illustrated in FIG. 2 on a carrier 50.

Figure 2:
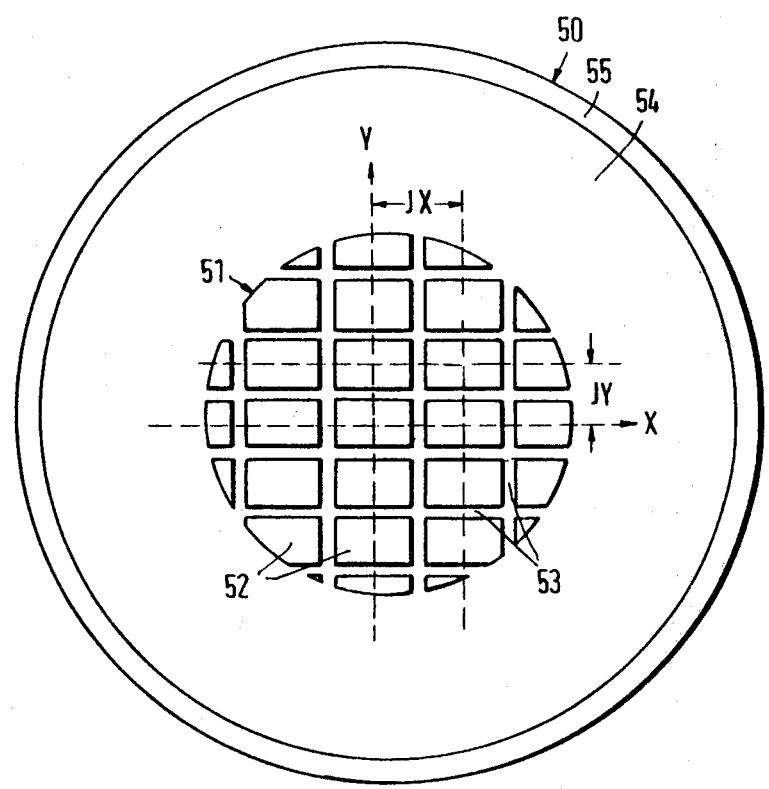
FIG. 2 shows a carrier with semiconductor bars as example of objects which can be aligned with the apparatus of FIG. 1.

FIG. 2 shows the originally circular semiconductor slice 51 on which is formed a large number of identical semiconductor devices 52 with rectangular outline. The semiconductor devices 52 all have the same size and are arranged in regular columns and rows. The semiconductor slice 51 is adhered to a support 54 which is for example a resilient plastic foil whose edge is clamped in a frame 55. The slice 51 is thereafter severed into individual bars 52, for example by sawing partly through the thickness of the slice along two perpendicular groups of spaced parallel lines thereby defining the edges of the bars 52. The partly sawn slice is then broken and the individual bars laterally separated from each other by stretching the plastic foil so that between the bars intermediate spaces 53 are formed in which the material of the support 54 is visible.

In FIG. 2 the size of the bars 52 is shown exaggerated relatively to the size of the semiconductor slice 51 and for this reason the number of bars in each row and column is only small. In reality the number of bars formed on a semiconductor slice may be very large and amount to several hundreds. Depending on the type of semiconductor device, the size of the bars may vary greatly, but the length of the edges is generally of the order of magnitude of a few millimeters.

As further apparent from FIG. 2 the bars lying at the edge of the slice, i.e. the last bars in each row and column, are generally incomplete and thus not usable. It may also occur that a bar is incomplete or missing entirely within a row.

To conduct further manipulations on the bars 52 which require an exact alignment of each bar the carrier 50 is mounted on the X-Y table 2 (FIG. 1) and angularly aligned exactly so that the rows lie in the X-direction and the columns in the Y-direction. The X-Y table 2 is displaced stepwise in the Y-direction in such a manner that the bars of a row are brought successively into coincidence with the reference point R. For this purpose, the X stepping motor 3 is in each case driven for a number of steps which corresponds to a displacement of the X-Y table 2 by the distance JX between the centre points of two bars 52 in the X-direction (FIG. 2). After going through a complete row in this manner, the Y stepping motor 4 is actuated for a number of steps which corresponds to a displacement of the X-Y table 2 in the Y-direction by the amount JY between two bars 52; the next row is then run through in the opposite displacement direction.

However, this stepwise displacement of the X-Y table 2 gives only an approximate setting of the bars 52 to the reference point R; in particular, a displacement error can add up to a considerable amount for a large number of bars. For many manipulations it is however necessary for each individual bar to be aligned very accurately with the reference point R, for example so that its centre point (intersection of the diagonals) is in exact coincidence with the reference point R. This alignment is effected by the apparatus illustrated in FIG. 1 following the stepwise displacement of the X-Y table 2.

For this alignment operation the portion of the surface of the carrier 50 lying above the reference point R is projected by an objective 5 onto the photo cathode of a television camera 6. The magnification of the objective 5 is preferably adjustable to adapt to different bar sizes; for example, the magnifications 20:1, 40:1 and 80:1 may be provided. The magnification is chosen in each case so that apart from the bar to be aligned a considerable surrounding area is projected, containing for example several complete bars.

In addition to the stepwise changing of the magnification, the objective 5 is preferably also designed so that an infinitely variable adjustment of the magnification (zoom effect) is possible in each magnification range.

The television camera 6 may be a standard commercially available power line synchronizing camera operating with line interlacing which produces at its output line 7 the analog video signals representing the imaged area together with the frame and line synchronizing pulses necessary for the reproduction. These normal video signals are transmitted via a line 8 to a video selector and mixer 100 which with corresponding adjustment delivers them via a line 9 to a monitor 10 so that a television picture of the area analysed by the objective 5 is displayed on the screen of the monitor 10.

The output line 7 of the television camera 6 is further connected to the input 201 of the video digitizer 200 which compares the analog video signals with an adjustable threshold value which is adjustable with the aid of a potentiometer 202. The digitizer 200 produces at its output 204 digital video signals DIGVID A having a high level (white) whenever the analog input signal exceeds the threshold value set at the potentiometer 202 and a low level (black) whenever the analog input signal is below the threshold value. The output 204 of the video digitizer 200 is connected to a further input of the video selector and mixer 100 which is adjustable by a setting device 101 so that it transmits the digital video signal DIGVID A to the monitor 10, the normal video signal supplied via the line 8 being simultaneously suppressed. The monitor 10 then displays on its screen a digital video image which consists only of white and black picture elements.

The threshold value for the digital video signal DIGVID A is set by means of the potentiometer 202 so that the video signals originating from the base 54 and thus also from the intermediate spaces 53 all remain below this threshold value whilst the video signals originating from the bars 52 for the major part exceed the threshold value. Thus, in the digital television picture reproduced by means of the signal DIGVID A the bars 52 appear predominantly white whilst the intermediate spaces 53 and the carrier 54 surrounding the slice 51 are displayed completely black.

The output line 7 of the television camera 6 is further connected to the input 301 of a sync separator 300. The latter separates the frame and line synchronizing pulses from the analog video signals and delivers the frame synchronizing pulses FR and the line synchronizing pulses LN at two separate outputs. The sync separator 300 has a third output at which it furnishes a composite synchronizing signal SYNC which contains both the frame syncrhonizing pulses and the line synchronizing pulses. This third output is connected to a further input of the video selector and mixer 100 so that the synchronizing signals necessary for the picture display on the monitor 10 are also available when the digital video signal DIGVID A is utilized for the display instead of the normal video signal.

The sync separator 300 has a fourth output at which it furnishes a signal TOP which for the entire duration of a selected frame has a high level and for the duration of the other frame a low level. By means of a setting device 302 either the even or the odd frames may be selected for producing the signal TOP; the particular frame selected is used for the marking and evaluation of the television picture explained in detail hereinafter. At a fifth outout a short pulse CLR is delivered which coincides with the leading edge of the signal TOP, i.e. with the start of the selected frame.

The output of the sync separator 300 carrying the line synchronizing signal LN is connected to the control input of a picture element generator 11 which furnishes at its output a sequence of picture element pulses PE which define individual picture elements along each television line. The picture element generator 11 is synchronized by the line synchronizing pulse LN so that the picture element pulses PE during the scanning of each television line occur in exactly defined always identical location with respect to the beginning of the television line and thus define picture elements lying vertically below each other in the various television lines. The recurrence frequency of the picture element pulses PE is approximately 9.3 MHz but can be adjusted by means of a setting device 12 for the purpose of an adjustment which will be explained in detail hereinafter.

The outputs of the sync separator 300 supplying the signals FR and LN and the output of the picture element generator 11 are connected to corresponding inputs of an alignment sequencer 400. Further inputs 401 of the alignment sequencer 400, for simplicity illustrated as a single line, are connected to an input device 402. On the basis of the input signals fed thereto the alignment sequencer 400 generates at eight output signals LNX 1, LNX 2, PEX 1, PEX 2, LNG A, LNG B, PEG A and PEG B which occur at predetermined instants and for a fixed duration in each selected frame and are fed on the one hand to a misalignment detector 450 and on the other to a marker generator 500. On the basis of the signals fed thereto the marker generator 500 generates marker signals MK A and MK B, which have two signal levels (black and white). It forms therefrom a composite marker signal MK A-B which by means of the video selector and mixer 100 can be superimposed on the video signal displayed on the monitor 10 so that on the reproduced television picture white marker lines are produced.

Figure 3:
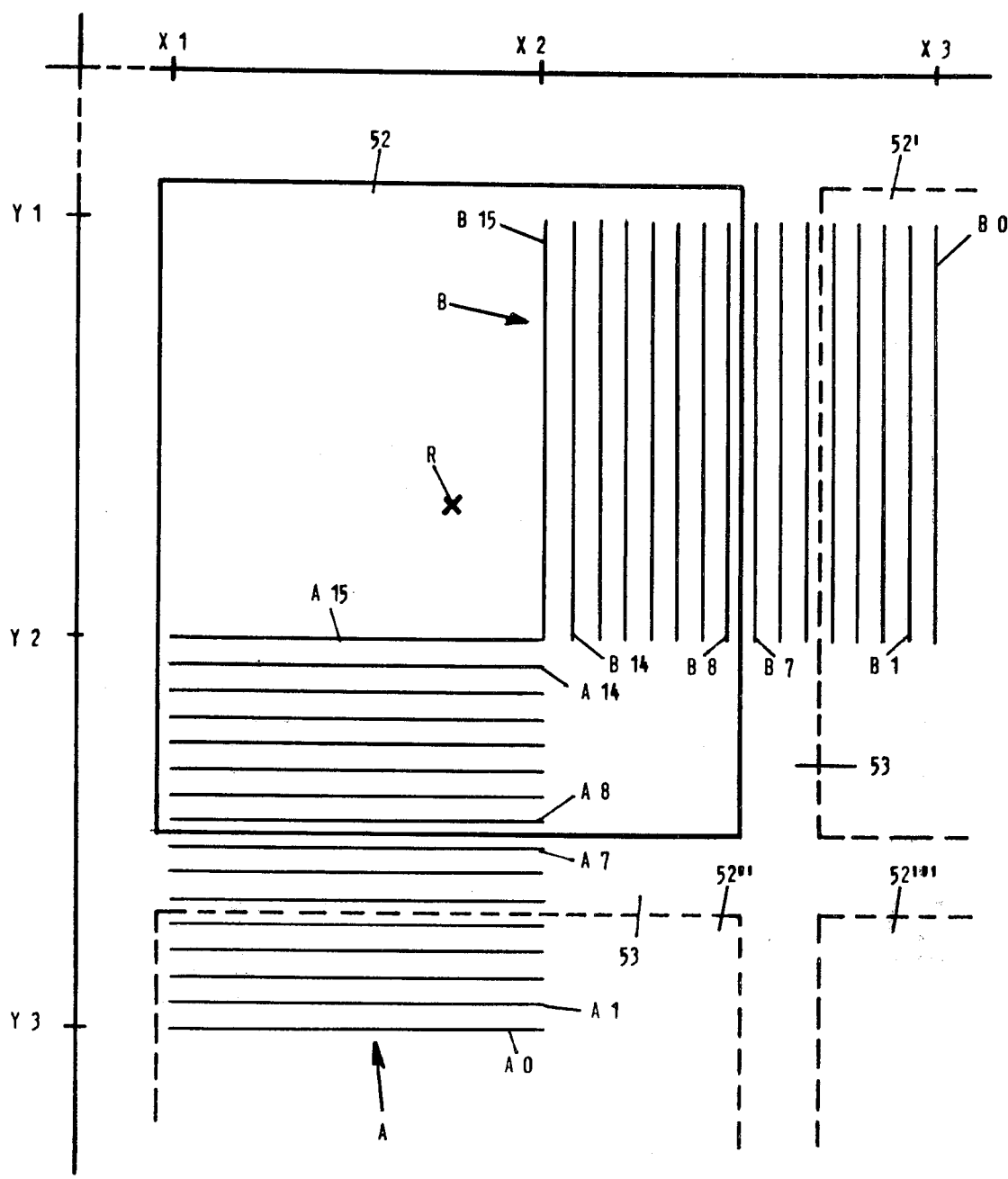
FIG. 3 shows the markers produced on the screen with the apparatus of FIG. 1.

The markers displayed on the television screen by means of the marker signals MK A and MK B are illustrated in more detail in FIG. 3. The marker signals MK A produce a set A of sixteen marker lines A 15 to A 0, each of which assumes a centre portion of a television line. Two successive marker lines of the set A are separated by an intermediate space which corresponds to one television line of the frame (i.e. three television lines of the complete picture). The marker signals MK B produce a set B of sixteen vertical marker lines B 15 to B 0 which extend in the vertical direction. Each marker line B has the width of a picture element defined by a picture element pulse PE and two consecutive vertical marker lines B have an interval which corresponds to two periods of the picture element pulses PE. In the example of embodiment illustrated the right ends of the marker lines A 15 to A 0 lie in the extension of the first vertical marker line B 15 and the lower ends of the marker lines B 15 to B 0 lie at the level of the first horizontal marker line A 15. This step is however not essential; the marker lines of the two sets A and B may also cross over each other or be at a greater distance apart.

The television camera 6 is so aligned that the line direction of the television picture corresponds to the X-direction of the X-Y table 2. Accordingly the edges of the image of the particular bar 52 to be aligned lie parallel to the horizontal marker lines A and the vertical marker lines B respectively. The length of the marker lines may be selected as desired; however, it is expedient for them to extend over a maximum possible part of the corresponding dimension of the bar 52. Furthermore, the marker lines assume on the television screen with respect to the imaginary image of the reference point R a location such that the bar 52 is exactly aligned with the reference point R when the lower horizontal edge of its image lies between the horizontal marker lines A 8 and A 7 and the right vertical edge lies between the marker lines B 8 and B 7.

In FIG. 3, in interrupted lines the outlines of the images of three bars 52', 52", 52''' are indicated which on the carrier 50 are adjacent the bar 52 to be aligned. The distances between the marker lines of each set A and B are so dimensioned that at least one marker line, preferably even several marker lines, lie completely within the space 53 between the video images of two adjacent bars. This means that the division of the marker lines in each set is smaller than the smallest interval 53. In the aligned position of the bar 52 illustrated in FIG. 3 eight marker lines of each set, i.e. the marker lines A 15 to A 8 and the marker lines B 15 to B 8, lie within the image of the bar 52 so that in the course of each of these marker lines by definition "white" picture elements occur for which the digitized video signal DIGVID A has the high signal value. On the other hand, at least the ninth marker line (A 7 or B 7) of each set lies completely in an interval 53 in which by definition only "black" picture elements occur for which the digitized video signal DIGVID A has the low signal value. Marker lines of each set disposed still further outwardly may come into the images of adjacent bars so that in the course of such marker lines "white" picture elements can again occur.

As regards the evaluation of the digital video signal DIGVID A the following criterion applies:

The bar 52 is correctly aligned with the reference point R when in each marker line set A and B in the course of eight marker lines, counted in uninterrupted sequence from the inside to the outside, white picture elements occur and the ninth marker line is the first marker line in the course of which no white picture elements occur, i.e. the digital video signal DIGVID A does not assume the high signal value.

The statement "from the inside to the outside" relates to the image of the respective bar to be aligned.

If however the bar 52 is not correctly aligned with the reference point R its image is displaced with respect to the marker line sets A and B so that the number of marker lines counted in uninterrupted sequence from the inside to the outside in the course of which white picture elements occur is greater or smaller than eight. The amount and sign of the difference gives directly the magnitude and direction of the position correction to be made. This difference is detected by the misalignment detector 450 which for this purpose, in addition to the output signals of the alignment sequencer 400 receives the marker signals MK A and MK B from the marker generator 500 and the digital video signals DIGVID A.

Figure 4A:
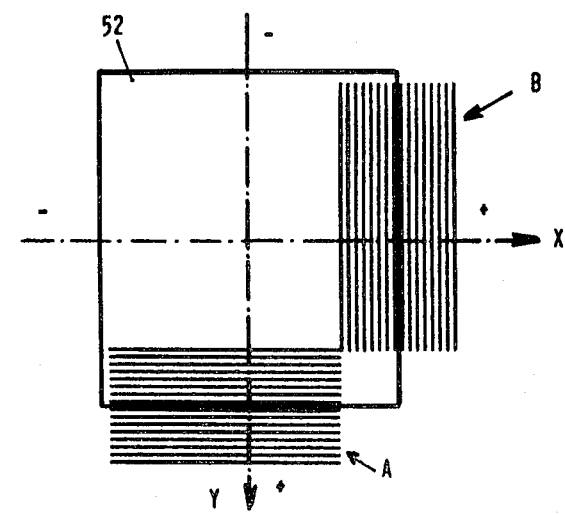
FIGS. 4a-c shows three different examples for the alignment of an object with respect to the markers.

In FIG. 4 three cases of the location of the image of a bar 52 with respect to the marker lines are illustrated. FIG. 4a corresponds to the illustration in FIG. 3, i.e. the correct alignment of the bar 52 with the reference point. Accordingly, the lower edge of the image of the bar 52 lies between the eighth and the ninth marker line of set A and the right edge lies between the eighth and the ninth marker line of set B.

The misalignment detector 450 contains detector circuits which during the times in which the marker signals MK A and MK B are generated in the course of the scanning of a frame analyse the digital video signal DIGVID A and respond whenever a white picture element appears in the picture area corresponding to a marker line. Furthermore, the misalignment detector 450 comprises for each of the marker line sets A and B a counting means which in uninterrupted sequence counts from the inside to the outside the number of those marker lines of the respective group in the course of which white picture elements are contained in the signal DIGVID A. The counting is terminated as soon as the first marker line in the course of which only black picture elements occur appears in the sequence of marker lines counted from the inside to the outside; if in the course of marker lines disposed further outside white picture elements again occur they are ignored in the counting.

The magnitude and direction of the correction to be made, expressed by the corresponding number Q of marker line intervals, is derived directly from the magnitude and sign of the difference between the number M of the counted marker lines and the number N of the marker lines which must lie within the image of the bar on correct alignment. In the example illustrated $N=8$ and for the correction magnitude Q the equation $$Q=8-M$$

applies. It is assumed here that the positive direction extends in the counting direction, i.e. in the X-direction to the right and in the Y-direction downwardly.

When the image of the bar 52 assumes the location illustrated in FIG. 4a the two counting means associated with the marker line sets A and B have on completion of the analysis each counted $M=8$ marker lines. Thus, for the correction to be performed in each direction the resulting value is $$Q=N-M=8-8=0.$$

Thus, no correction is necessary in any direction.

Figure 4B:
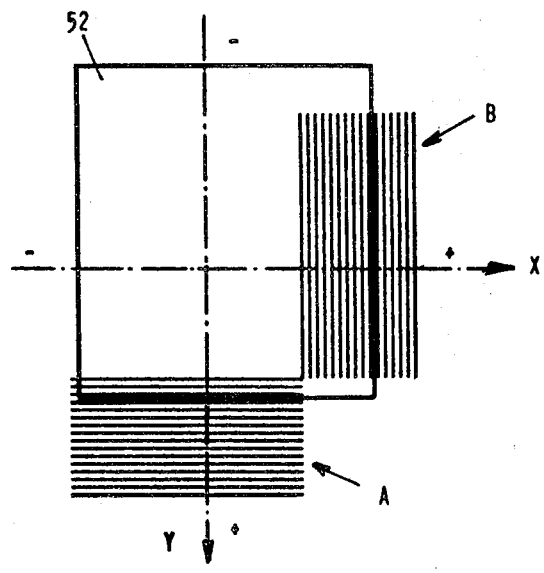

In the illustration of FIG. 4b it is assumed that the image of the bar 52 is displaced with respect to the correct location upwardly (in the negative Y-direction) and to the right (in the positive X-direction) so that the lower edge lies between the third and fourth marker lines of the set A whilst the right edge lies between the tenth and eleventh marker lines of the set B. In this case, the counting means of the misalignment detector 450 associated with the set A has counted on completion of the analysis $M=3$ marker lines whilst the counting means associated with the set B has counted $M=10$ marker lines. The resulting value for the correction in the Y-direction is thus $$Q=N-M=8-3=5,$$

i.e. an adjustment corresponding to five marker line intervals in the positive Y-direction.

For the correction in the X-direction the value is $$Q=N-M=8-10=2,$$

i.e. an adjustment corresponding to two marker line intervals in the negative X-direction.

Depending on the imaging scale selected, the distance between two marker lines of each set corresponds to an exactly defined mechanical displacement of the X-Y table 2. For example, with a magnification of 20:1 the distance between two marker lines can correspond to a displacement of the X-Y table 2 by 20 $\mu$m. Thus, in the previously given numerical example in which each adjustment step of one of the stepping motors 3 and 4 corresponds to a displacement of the X-Y table 2 by 10 $\mu$m, for the case of FIG. 4b the Y motor 4 would have to execute ten steps in the direction of rotation corresponding to the positive Y-direction and the X motor 3 would have to execute 4 steps in the direction of rotation corresponding to the negative X-direction to align the bar 52 correctly with the reference point R. The exact calibration may be effected in the Y-direction by fine adjustment of the optical magnification by means of the zoom effect of the objective 5 and in the X-direction by changing the frequency of the picture element generator 11 by means of the setting device 12, since this frequency determines the period of the picture element pulses PE and thus the interval of the picture elements along the lines.

Figure 4C:
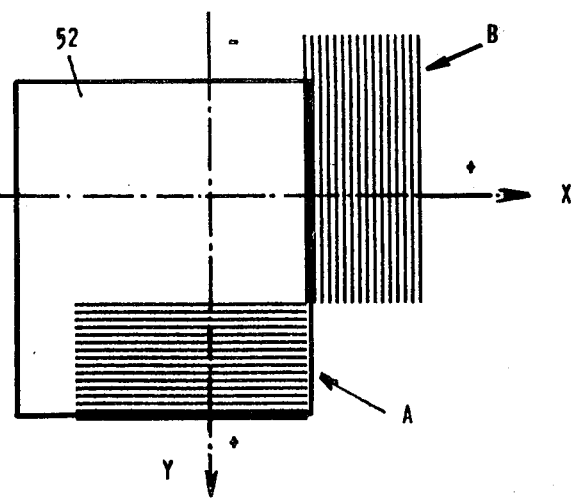

FIG. 4c shows the case where the image of the bar 52 covers fifteen marker lines of the set A and only one marker line of the set B. In this case, at the end of the analysis the counting means associated with the set A has counted $M=15$ marker lines whilst the counting means associated with set B has counted $M=1$ marker lines. Thus, the correction necessary in the Y-direction is $$Q=8-15=-7,$$

i.e. seven marker line intervals in the negative Y-direction, and the correction necessary in the X-direction is $$Q=8-1=7,$$

i.e. seven marker line intervals in the positive X-direction. This means that each of the two stepping motors 3 and 4 must execute fourteen steps in the corresponding direction of rotation so that a displacement of the X-Y table 2 by 140 $\mu$m in the positive X-direction and by 140 $\mu$m in the negative Y-direction is effected.

The illustration of FIG. 4c shows the maximum alignment correction which can still be carried out with the apparatus described. If the image of the bar 52 is displaced still further so that in at least one set either all sixteen marker lines are covered or not one marker line an alignment is no longer possible; in this case the associated counting means emits an overflow signal.

As subsequently explained in detail with reference to FIG. 8, in the example of embodiment described the counting means contained in the misalignment detector 450 are so constructed that they indicate directly the difference $Q=N-M$ and the sign of this difference. The misalignment detector 450 (FIG. 1) has two output groups 451 A and 451 B. The output group 451 A belongs to the counting means which is associated with the marker line set A and the output group 451 B belongs to the counting means which is associated with the marker line set B. Each output group transmits a 3-bit binary number and an overflow bit. The 3-bit binary number of the output group 451 A indicates the amount of the difference $Q=N-M$ belonging to the marker line set A. At two further outputs it is indicated whether the adjustment is to be made in the positive Y-direction or in the negative Y-direction. In corresponding manner the signals belonging to the marker line set B appear at the output group 451 B. The overflow bit of each output group appears when the amount of the corresponding difference is greater than seven so that a correction of the misalignment is no longer possible.

Thus, in the case of FIG. 4b the output group 451 A supplies the binary number 101 (=5) and a signal which indicates that a displacement of the X-Y table 2 is necessary in the positive direction, and the output group 451 B supplies the binary number 010 (=2) and a signal which indicates the necessity of displacement in the negative X-direction.

In the case of FIG. 4c the two output grous 451 A and 451 B each indicate the binary number 111 (=7), and the associated direction signals indicate that the adjustment must take place in the negative Y-direction and in the positive X-direction.

The output groups 451 A and 451 B are connected to corresponding inputs of a displacement control device 14 which decodes the input signals fed thereto and produces therefrom control signals which are fed via a line 15 to the X-motor 3 or via a line 16 to the Y-motor 4 and effect rotation of said motors by the necessary number of steps in the respective direction. The displacement control device 14 controls the stepping motors 3 and 4 for executing the adjustments JX and JY as well, the magnitude of which is adjustable by means of a setting device 17 for adaptation to the particular bar processed.

The location and possibly also the length of the marker lines may be adapted to the shape and size of the bars (or other workpieces) to be aligned. This is done by means of digital data supplied from the control means 402 to the input 401 of the alignment sequencer 400. The control means 402 may be a manually actuated keyboard or a source of stored or programmed information. The digital data fed to the input 401 determine the picture lines or picture elements of the television picture which are used to generate the marker lines.

The more detailed makeup of the various circuits contained in the system of FIG. 1 is illustrated in FIGS. 6 to 9. The functions of these circuits and the generation of the various signals will be explained in particular with reference to FIGS. 3 and 5.

As already mentioned, the line direction (horizontal sweep) of the television picture corresponds to the X-direction and the direction perpendicular thereto (vertical sweep direction) corresponds to the Y-direction. Each point of the television picture can thus be clearly determined by an X coordinate and a Y coordinate. This makes it possible in particular to clearly the define the borders of the various marker lines and marker areas on the screen.

In FIG. 3 at the upper edge in the horizontal direction (X-direction) three X coordinates X 1, X 2, X 3 are shown. At the left edge in the vertical direction (Y-direction) three Y coordinates Y 1, Y2, Y 3 are shown.

The coordinate X 1 indicates the distance of the beginning of the horizontal marker lines of the set A from the left image edge (line begin). The coordinate X 2 defines the location of the first vertical marker line B 15 of the set B and the end of the horizontal marker lines of the set A. The coordinate X 3 indicates the locaton of the last marker line B 0 of the set B.

In the same manner the coordinate Y 1 corresponds to the distance of the upper end of the vertical marker lines of the set B from the upper image edge (start of the frame) and the coordinate Y 2 corresponds to the location of the first horizontal marker line A 15 of the set A and to the lower end of the vertical marker lines of the set B. The coordinate Y 3 defines the location of the last horizontal marker line A 0 of the set A.

The coordinates X and Y not only denote spatial points on the television picture but also predetermined instants during the scanning of the television picture. Thus, each coordinate Y can be readily defined by a predetermined number of line synchronizing pulses LN which are counted from the start of the frame (frame synchronizing pulse FR) or from a preceding Y coordinate. Likewise, each X coordinate can be defined by a predetermined number of picture element pulses PE which are counted from the start of the respective television line (line synchronizing pulse LN) or from a preceding X coordinate. By counting the line synchronizing pulses LN and the picture element pulses PE it is thus possible to define exactly each point within the television picture.

The circuits described hereinafter produce in particular predetermined control signals at instants which correspond to predetermined previously defined X coordinates and Y coordinates and they employ these control signals to generate the marker signals.

Figure 5:
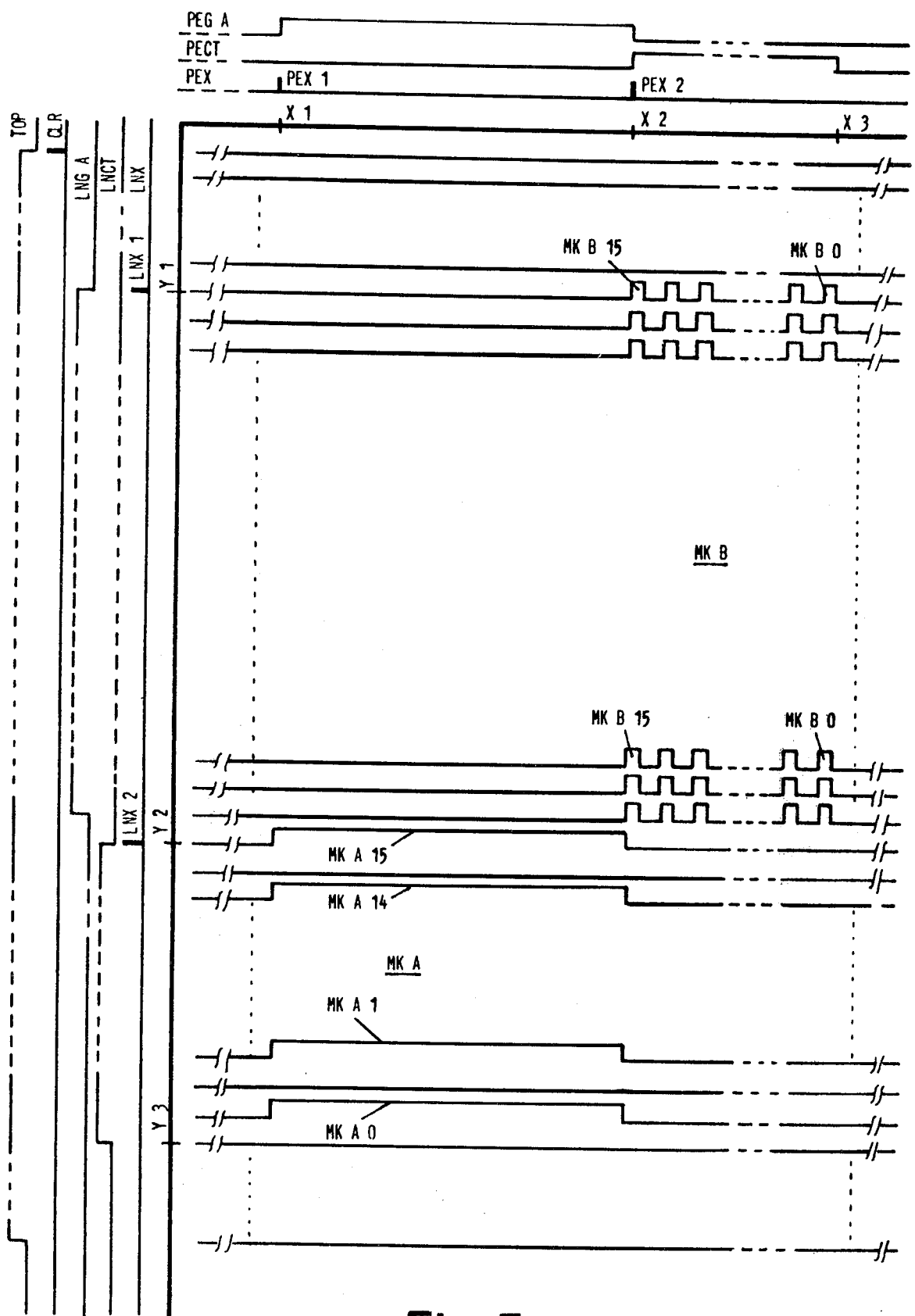
FIG. 5 is a time diagram of signals generated in the apparatus of FIG. 1.
Figure 6:
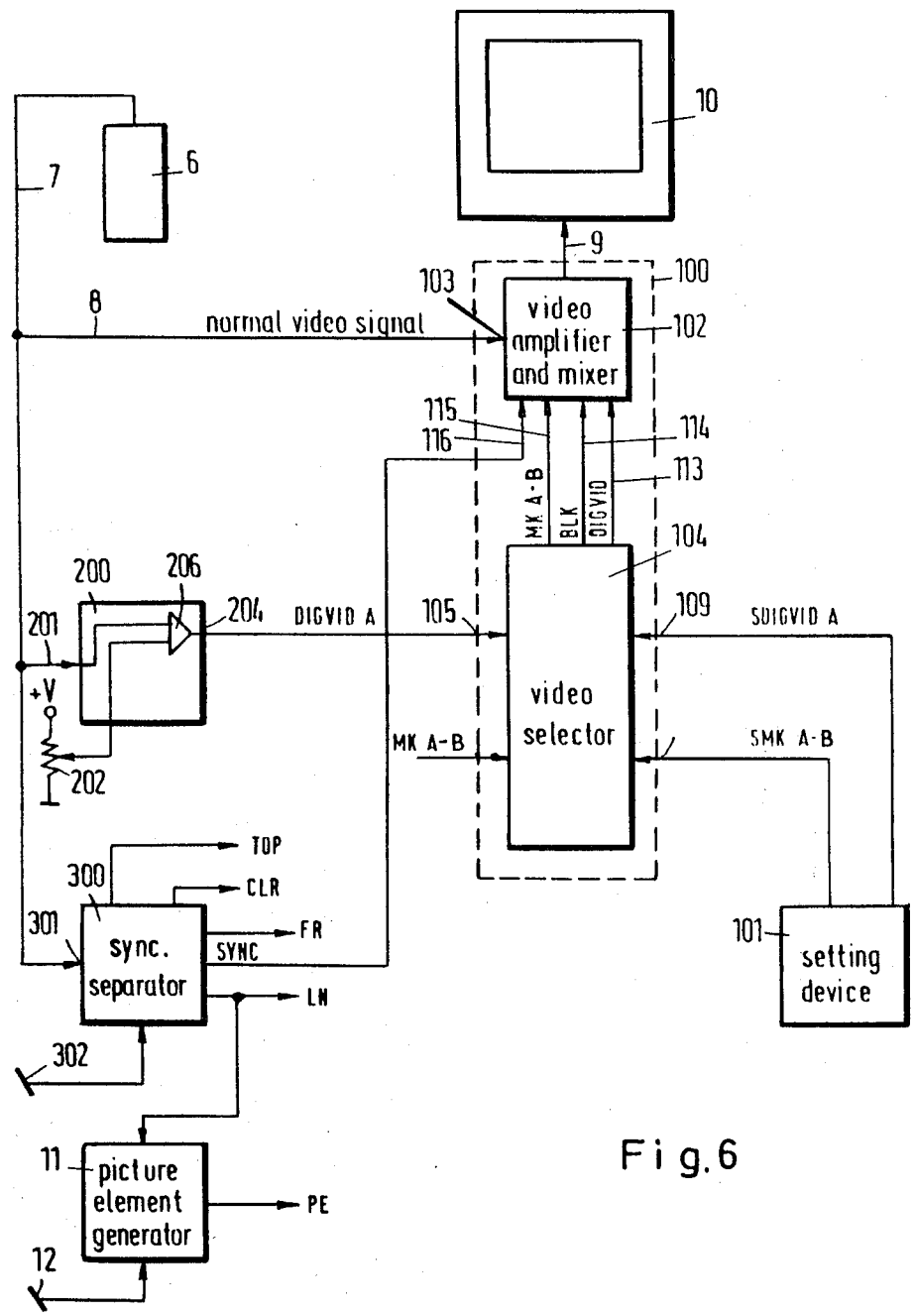
FIG. 6 is a more detailed circuit diagram of some components of the apparatus of FIG. 1.

In FIG. 5 within the thickly drawn border the marker signals MK A and MK B are schematically illustrated in a row of horizontal time axes which each correspond to a television line of the frame used for the marking. At the upped edge various control signals are illustrated which are produced during the scanning of all or some of the television lines and thus substantially recur with the line frequency. Along the vertical left edge control signals are shown which are generated during the scanning of the frame and thus recur with the frame frequency.

FIG. 6 again shows the components 6, 10, 11, 100, 200, 300, of the system of FIG. 1 and in particular clearly indicates the makeup and function of the video selector and mixer 100.

The latter comprises a video amplifier and mixer 102 and a video selector 104. The normal video signal supplied via the line 8 is fed to an input 103 of the video amplifier and mixer 102 and transmitted by the latter via the line 9 to the monitor 10 unless a digital video signal is requested at the video selector 104. The digital video signal DIGVID A is supplied to an input 105 of the video selector 104 which also receives at an input 107 the composite marker signal MK A-B. The video selector 104 further comprises two control inputs 109, 111 which are connected to the setting device 101. The video selector 104 is connected via three output lines 113, 114, 115 to the video amplifier and mixer 102 which also receives at an input 116 the composite synchronizing signal SYNC from the sync separator 300.

If instead of the normal video signal the digital video signal DIGVID A is to be displayed on the monitor 10, by means of the setting device 101 a control signal DIGVID A is applied to the control input 109. The video selector 104 then transmits the digital video signal DIGVID A from the input 105 via the output line 113 to the video amplifier and mixer 102 and simultaneously furnishes on the output line 114 a blanking signal BLK which in the video amplifier and mixer 102 blocks the normal video signal supplied to the input 103. The synchronizing signals necessary for displaying the digital video images are available simultaneously at the input 116 of the video amplifier and mixer 102.

By applying a control signal SMK A-B to the control input 111 of the video selector 104 the composite marker signal MK A-B supplied to the input 107 is transmitted via the output line 115 to the video amplifier and mixer 102 and in the latter superimposed on the particular video signal displayed, i.e. either on the normal video signal supplied to the input 103 or the digital video signal DIGVID A transmitted via the line 113. The marker lines A and B are then displayed on the screen of the monitor 10 superimposed on the displayed video image. The setting device 101 may for example be a manually actuated keyboard which on actuation of corresponding keys emits the necessary control signals in the form of signal levels.

The video digitizer 200 includes a threshold value comparator 206 in the form of an operational amplifier which receives at its non-inverting input the normal video signal furnished by the television camera 6, whilst the inverting input is connected to the tap of the potentiometer 202. In accordance with the usual mode of operation the threshold comparator furnishes an output signal of low level (black) as long as the analog signal supplied to the non-inverting input remains below the potential across the inverting input, whereas in the opposite case an output signal with high level (white) is furnished. As already mentioned, the potentiometer 202 is set so that the threshold value for the comparator 206 is adapted to the contrast between the highly reflecting surface of the bar 52 and the weakly reflecting surface of the base 54 or the intervals 53 between the bars. The threshold value may be optimally adjusted for the respective particular use by means of the potentiometer 202.

Figure 7:
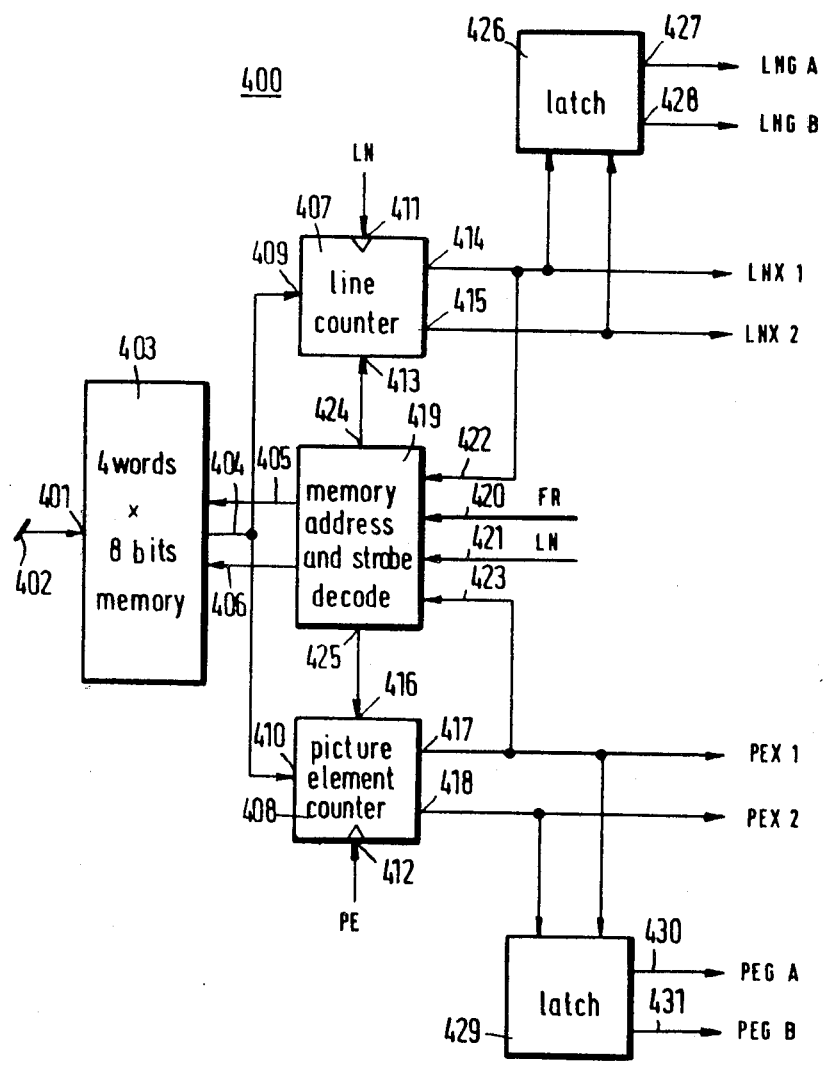
FIG. 7 is a more detailed circuit diagram of the alignment sequencer.
Figure 8:
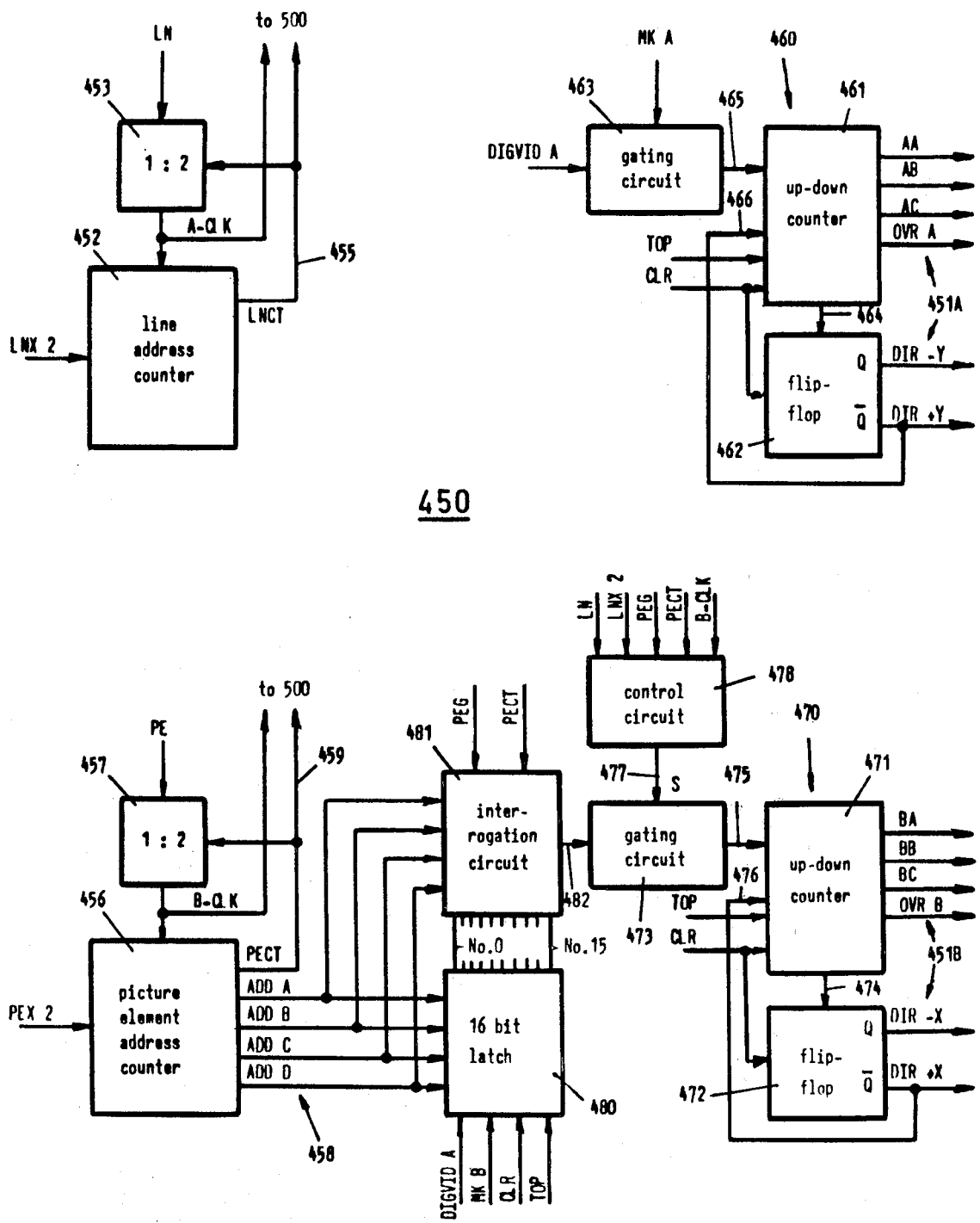
FIG. 8 is a more detailed circuit diagram of the misalignment detector.
Figure 9:
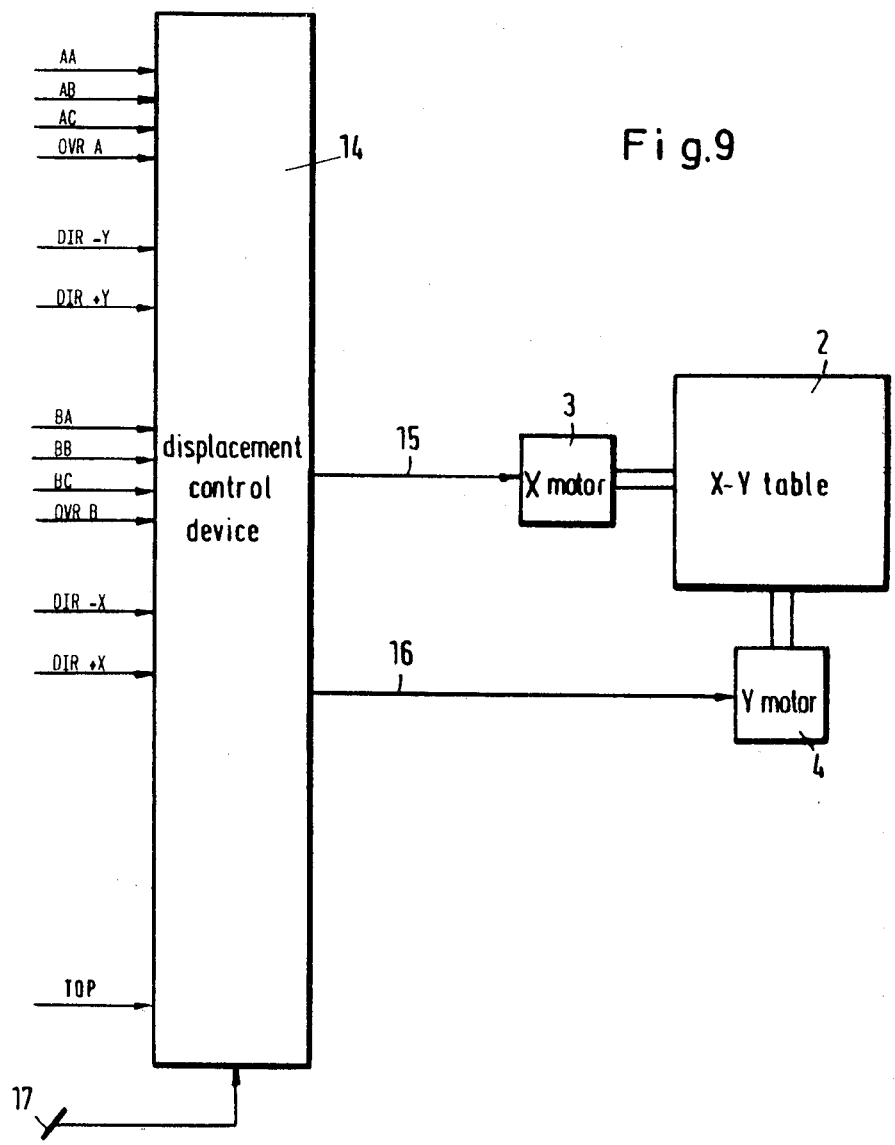
FIG. 9 is a block diagram of the displacement control device and an error detector.

FIG. 7 shows in great detail the block circuit diagram of the alignment sequencer 400 which is followed to the right by the misalignment detector 450 illustrated in FIG. 8, this being followed in turn by the displacement control device 14 illustrated in FIG. 9. The mode of operation of these circuits will be explained in particular with reference to FIG. 5.

The production of the marker signals MK B for the display of the vertical marker lines of the set B begins when during a frame scanning the frame line designated by the coordinate Y 1 is reached. Since these marker lines are perpendicular to the television line direction, only one picture element of them can be displayed in each line. The marker signals MK B thus consist in each frame line of sixteen successive short pulses with half the frequency of the picture element pulses PE, which are generated between the instants X 2 and X 3. These pulses recur in each frame line until the frame line corresponding to the coordinate Y 2 is reached.

Between the coordinates Y 2 and Y 3 the marker signals MK A are then generated. The first marker signal MK A used for the display of the marker line A 15 is generated when in the frame scanning the scanning line denoted by the coordinate Y 2 is reached. During the scanning of this line the marker signal MK A 15 assumes at the instant corresponding to the coordinate X 1 a high level which it retains until the instant X 2. The same operation repeats itself for the other marker signals MK A 14 to MK A 0 in every other frame line until the coordinate Y 3 is reached whilst in the respective lines therebetween no marker signal MK A is generated.

The marker signals MK A and MK B are produced in dependence upon data which define the coordinates X 1, X 2, Y 1 and Y 2 and are recorded in a memory 403 (FIG. 7) which has a capacity of four words each of 8 bits. These data determine the dimensions and location of the marker lines and are fed into the input 401 of the memory with the aid of the control means 402. The memory word defining the coordinate X 1 is the number of the picture element pulses PE furnished from the start of the line (line synchronizing pulse LN) up to the coordinate X 1; the memory word determining the coordinate X 2 is the number of the picture element pulses PE emitted between the instants X 1 and X 2. The memory word determining the coordinate Y 1 is the number of line synchronizing pulses LN emitted from the frame start (frame synchronizing pulse FR) up to the instant Y 1; the memory word determining the coordinate Y 2 is the number of line synchronizing pulses LN emitted between the instants Y 1 and Y 2.

The memory 403 has an output 404 and two address inputs 405 and 406. The output 404, which is in fact a multiple output at which the eight bits of a stored word are emitted in parallel, is connected to the preset inputs 409, 410 of two presettable reverse counters 407, 408. The counter 407 receives at its clock input 411 the line synchronizing pulses LN and serves as line counter. The counter 408 receives at its clock input 412 the picture element pulses PE and serves as picture element counter. The line counter 407 also has a present control input 413 and two outputs 414, 415; the picture element counter 408 has a preset control input 416 and two outputs 417, 418.

The address inputs 405 and 406 of the memory 403 are connected to two outputs of a memory address and strobe decode 419 which at a trigger input 420 receives the frame synchronizing pulses FR and at a further trigger input 421 the line synchronising pulses LN. A further trigger input 422 is connected to the output 414 of the line counter 407 and a fourth trigger input 423 is connected to the output 417 of the picture element counter 408. The memory address and strobe decode 419 has two further outputs 424 and 425 which are connected to the preset control input 413 of the line counter 407 and to the preset control input 416 of the picture element counter 408 respectively.

The outputs 414 and 415 of the line counter 407 are connected to two inputs of a latch 426 which has two complementary outputs 427, 428 and the outputs 417, 418 of the picture element counter 408 are connected to two inputs of a latch 429 which has two complementary outputs 430, 431.

With each frame synchronizing pulse FR supplied to the input 420 of the memory address and strobe decode 419 the memory is addressed and driven via its inputs 405, 406 so that it furnishes at its output 404 the first memory word which in the previously outlined manner indicates the coordinate Y1 in the form of a predetermined line number. An enable pulse emitted simultaneously at the output 424 of the memory address and strobe decode 419 and supplied to the preset control input 413 of the line counter 407 effects that said counter is preset to the number provided by the memory. The leading edge of the frame synchronizing pulse FR effects the addressing of the memory 403 whilst its trailing edge initiates the transfer of the memory word read to the counter. The same also applies to the other trigger pulses supplied to the inputs 421, 422, 423 of the memory address and strobe decode 419.

The line counter 407 is advanced by th line pulses LN supplied to its clock input 411 so that its content is reduced by one unit for each line pulse. As soon as it has reached zero count it emits at its output 414 a pulse LNX 1. This pulse therefore coincides with the start of the line denoted by the coordinate Y1 (FIG. 5). The pulse LNX 1 is also supplied to the trigger input 422 of the memory address and strobe decode 419 and in the manner outlined above results in the addressing and emission of the memory word from the memory 403 which represents the coordinate Y2 by the number of lines lying between the coordinates Y1 and Y2. The line counter 407 is preset to this number and again counted down by the line synchronizing pulses LN supplied to its clock input 411. When it has reached zero count it emits at its output 415 a pulse LNX 2 which thus coincides with the start of the line corresponding to the coordinate Y2 (FIG. 5). This operation is repeated in each frame so that during the scanning of each frame a pulse LNX 1 and a pulse LNX 2 appears.

The memory 403 is addressed and interrogated by the first line synchronizing pulse LN appearing after the frame synchronizing pulse FR in such a manner that said memory transmits to the picture element counter 408 a memory word which in the previously explained manner represents the coordinate X1 by a number of picture elements. The picture element counter 408 is counted down by the picture element pulses PE supplied to its clock input 412 and on reaching zero count furnishes at its output 417 a pulse PEX 1 which thus occurs during the scanning of a line at the instant corresponding to the coordinate X1 (FIG. 5). The pulse PEX 1 is also applied to the trigger input 423 of the memory address and strobe decode 419 and as a result the memory 403 transfers to the picture element counter 408 the memory word which defines the coordinate X2 by the number of picture elements lying between X1 and X2. The picture element counter is again counted down by the picture element pulses PE and on reaching zero count furnishes at the output 418 a pulse PEX 2 which during the line scanning occurs at the instant corresponding to the coordinate X2. The same operation is initiated by each following line pulse LN so that in each line of the frame a pulse PEX 1 and a pulse PEX 2 are generated.

The pulse LNX 1 applied from the output 414 of the line counter 407 to the latch 426 brings the latter into a position in which the potential at the output 427 assumes a high level and simultaneously the potential at the complementary output 428 assumes a low level. The pulse LNX 2 furnished at the output 415 of the line counter 407 brings the latch 426 into the other position in which the potential at the output 427 is low and the potential at the output 428 is high. The latch 426 thus furnishes at the output 427 a signal LNG A which in each frame has a high level between the coordinates Y1 and Y2 and a low level in the other part of the frame. Correspondingly, the signal LNG B complementary thereto at the output 428 has from the coordinate Y2 of a frame to the coordinate Y1 of the next frame a high level but a low level between the coordinates Y1 and Y2 of each frame.

In the same manner the pulses PEX 1 and PEX 2 supplied to the latch 429 effect that the signal PEG A (FIG. 5) furnished at the output 430 has a high level in each line between the coordinates X1 and X2 and a low level in the remaining portion of the line whilst the complementary signal PEG B furnished at the output 431 has a high level from the coordinate X2 of a line to the coordinate X1 of the following line and a low level between the coordinates X1 and X2.

The misalignment detector 450 illustrated in FIG. 8 includes a line address counter 452 in the form of a fourstage binary counter with a preset input to which the signal LNX 2 is applied by the output 415 of the alignment sequencer 400 (FIG. 7). The clock input of the binary counter 452 is connected to the output of a frequency divider 453 to which the line synchronizing pulses LN are supplied and which furnishes at its output pulses having half the recurrence frequency of the line synchronizing pulses LN. The line address counter 452 is so designed that it is reset to the count 15 by each pulse LNX 2 supplied to its reset input and then counted down by the pulses supplied to its clock input with half the recurrence frequency of the line synchronizing pulses. For the entire duration of the counting from the start of the presetting until zero count has been reached the line address counter 452 furnishes at an output 455 a signal LNCT of high level (FIG. 5). This signal LNCT is applied to an enable input of the frequency divider 453 so that the latter emits output pulses only whilst this signal LNCT obtains. Thus, after each presetting by a signal LNX 2 at the output of the frequency divider 453 a group of sixteen clock pulses CLK appears with half the recurrence frequency of the line synchronizing pulses LN and the binary counter 452 remains stationary after reaching zero count until the next presetting by a signal LNX 2. The signal LNCT and the pulse group A-CLK emitted for its duration by the output of the frequency divider 453 are supplied to the marker signal generator 500 illustrated in FIG. 10 as indicated by arrows.

During the existence of the signal LNCT the content of the ne address counter 452, proceeding from the initial count 15, is reduced in every other frame line by one until the count zero is reached; the reverse counting is then terminated. In the course of this counting the count of the line address counter 452 indicates in each case the number of the marker line A 15, A 14, ... A 1, A0 which is associated with the frame line to which the line synchronizing pulse effecting the advancing belongs. These "line addresses" available in the line address counter 452 are however not used in the circuit illustrated.

Furthermore, the misalignment detector 450 includes a picture element address counter 456 in the form of a 4-bit binary counter having a preset input which receives the signal PEX 2 from the output 418 of the alignment sequencer 400 (FIG. 7) and a clock input which is connected to the output of a frequency divider 457 which receives the picture element pulses PE and furnishes clock pulses with half the recurrence frequency of the picture element pulses PE. The picture element address counter 456 is made up in the same manner as the 4-stage binary counter 452; it is thus set to the count 15 by each pulse PEX 2 and thereafter counted down until zero count is reached by the clock pulses with half the recurrence frequency of the picture element pulses PE. At an ouput 459 for the entire duration of the counting a signal PECT is furnished which is applied as enable signal to the frequency divider 457 which consequently supplies a group of sixteen clock pulses B-CLK after each presetting by a signal PEX 2. The signal PECT is present in each picture line between the coordinates X 2 and X 3. Additionally, the picture element address counter 456 comprises a group 458 of four outputs which are the outputs of the binary counter stages and furnish binary signals ADD A, ADD B, ADD C, ADD D which indicate the particular count in the form of a 4-bit binary number. The binary numbers appearing at the outputs 458 thus indicate the numbers of the marker lines B 15 to B 0 to which the pulses of the marker signals MK B 15 to MK B 0 generated in this frame line belong. The reverse counting in the counters 452 and 456 is the reason why the marker lines A 15 to A 0 and B 15 to B 0 are numbered backwards.

Figure 10:
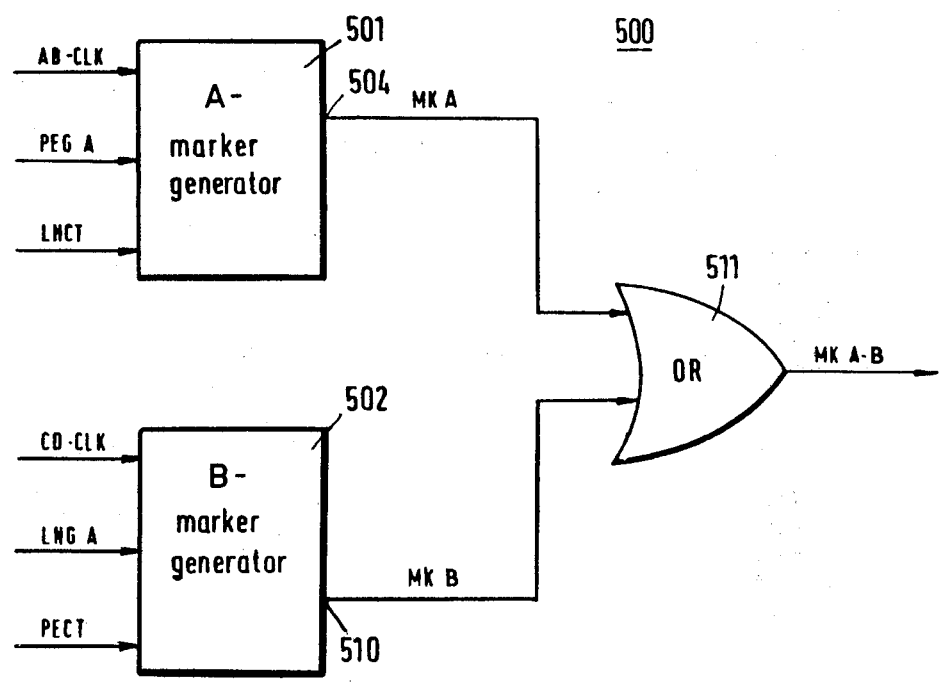
FIG. 10 is a more detailed circuit diagram of the marker generator.

The marker generator 500 illustrated in FIG. 10 includes an A marker generator circuit 501 and a B marker generator circuit 502. The A marker generator circuit 501 receives at three inputs the following signals:

A-CLK (from the output of the frequency divider 453, FIG. 8)

PEG A (from the output 430 of the latch 429, FIG. 7)

LNCT. (from the output 455 of the line address counter 452, FIG. 8).

From these signals, by digital gatings signals are formed which in every other frame line of the frame portion defined by the signal LNCT during the existence of the signal PEG A, i.e. between the coordinates X 1 and X 2, have the high signal value (white). The signals obtained by the gating are furnished at the output 504 as marker signals MK A.

The B marker generator circuit 502 receives at three inputs the following signals:

B-CLK (from the output of the frequency divider 457, FIG. 8)

LNG A (from the output 427 of the latch 426, FIG. 7)

PECT (from the output 459 of the picture element address counter 456, FIG. 8)

From these signals by digital gatings signals are formed which in every frame line of the frame portion defined by the signal LNG A, i.e. between the coordinates Y 1 and Y 2, for each clock pulse of the clock pulse groups B-CLK have the high signal value (white). The signals obtained by the gating are furnished as marker signals MK B at the output 510.

The outputs 504 and 510 of the two marker generator circuits 501, 502 are connected to the two inputs of an OR gate 511. At the output of the OR gate 511 a composite marking signal MK A-B is thus obtained which can be supplied via the video selector and mixer 100 to the monitor 10 for displaying the marker lines A and B.

The marker signals MK A and MK B are also applied as data windows to the circuits contained in the misalignment detector 450 (FIG. 8) with which the occurrence of white picture elements in the regions of the digital video image corresponding to the marker lines A 15 to A 0 and B 15 to B 0 is detected.

Data windows are of course defined time portions within a period within which any data occurring are transmitted or processed whilst the data not appearing within the data window are excluded from transmission and processing. A data window may consist of a continuous time period or a plurality of periods at intervals. In the present case each of the marker signals MK A 15 to MK A 0 and MK B 15 to MK B 0 defines a data window within a period corresponding to a frame scanning. Each data window defined by a marker signal MK A 15 to MK A 0 corresponds to a continuous time section which lies within the centre portion of a line period. On the other hand, each data window defined by a marker signal MK B 15 to MK B 0 corresponds to a plurality of very short time sections which succeed each other with the interval of a line period.

Since each instant of the frame scanning is reversibly clearly associated with an image dot on the screen, each data window corresponds to a defined local area of the video picture. These local areas may be made visible in the form of marker lines on the screen. The marker lines may thus be regarded as the visual display of the data windows.

As already explained, the misalignment detector 450 detects in the course of a single frame scanning the marker lines of each set A or B which correspond to the regions of the digitized video picture in which white picture elements are contained, and it furnishes output signals which designate the number of these marker lines counted in uninterrupted sequence from the inside to the outside up to the first marker line of each group corresponding to a region of the digitized video picture in which no white picture elements occur. This is equivalent to the determination of the data windows corresponding to the marker lines within which the digital video signal DIGVID A assumes the high signal value (white).

For this purpose, the misalignment detector 450 includes a misalignment counting means 460 for the horizontal marker line set A and an alignment counting means 470 for the vertical marker line set B.

The misalignment counter means 460 includes a four-stage up-down binary counter 461 and a flip-flop 462. The counter 461 may be set to forward or reverse counting by a signal applied to its control input 466; said control input 466 is connected to the complementary output $\overline{Q}$ of the flip-flop 462. The set input of the flip-flop 462 is connected to an output 464 of the counter 461 at which a signal is furnished when the counter has the count zero (0000). At the start of each frame the up-down counter 461 is preset by the signal CLR to the count 8 (1000) and the flip-flop 462 is reset so that the counter 461 is set to reverse counting. The clock input 465 of the counter 461 is connected to the output of a digital gating circuit 463 which at one input receives the marker signals MK A and at the second input the digital video signal DIGVID A. The gating circuit is so designed that its output signal assumes the high signal value when its two input signals simultaneously have the high signal value and then retains this signal value irrespective of changes of the digital video signals DIGVID A until the marker signal MK A returns to the low signal value. The rising front of each output signal of the gating circuit 463 effects a counting step of the up-down counter 461. The gating circuit 463 is furthermore so designed that it blocks the emission of further output signals as soon as no output signal has appeared in the course of a marking signal MK A even if during subsequent marker signals MK A the condition for the appearance of an output signal is again fulfilled, i.e. the simultaneous presence of a high signal value of the digital video signal DIGVID A and of the marker signal MK A.

Thus, if during each of the first eight marker signals MK A 15 to MK A 8 of the set MK A the digital video signal DIGVID A assumes the high signal value at least once the count of the up-down counter 461 will be reduced for each of said marker signals by one unit until it finally reaches the value zero for the marker signal MK A 8. At this count a signal appears at the output 464 by which the flip-flop 462 is set so that the output signal at the output $\overline{Q}$ changes the signal value and switches the counter 461 to forward counting. For each of the following eight marker signals MK A 7 to MK A 0, for which the same condition is fulfilled, the count of the up-down counter 461 is then again increased by one unit until it finally reaches the value 8 (1000) at the marker signal MK A 0. If however during a marker signal MK A the digital video signal DIGVID A does not assume the high signal value the counting operation is terminated and the up-down counter 461 remains on the count reached until it is reset to its starting condition at the start of the next frame scanning by the signal CLR.

This type of counting has the advantage that the count of the up-down counter 461 indicates directly the number of the marker line intervals of the set A by which the image of the bar 52 must be displaced in the Y-direction to reach the alignment position in which the lower horizontal edge is disposed between the eighth marker line A 8 and the ninth marker line A 7 (FIG. 4a). The signals at the two outputs Q and $\overline{Q}$ of the flip-flop 462 show whether this adjustment must take place in the positive or in the negative Y-direction.

The up-down counter 461 comprises a group of four outputs which together with the two outputs of the flip-flop 462 form the output group 451 A illustrated in FIG. 1. The three first outputs of this group are the stage outputs of the last three stages of the counter; at these three outputs a group of three binary signals AA, AB, AC thus appears and these signals represent the count reached in the form of a three-bit binary number when this count is less than 8 (1000).

A further output of each counter which is directly the output of the counter stage associated with the highest digit value furnishes a binary signal OVR A which has the value "0" when the count is less than 8 and the value "1" when the count reached is 8 (or more). The signal value "1" appears in the present case in the up-down counter 461 only when the latter either remains on the preset value 8, i.e. no marker signals MK A at all have been counted, or when during the forward counting the count 8 is again reached, i.e. all sixteen marker signals MK A 15 to MK A 0 have been counted. The first case means that all sixteen marker lines of the set A lie outside the image of the bar and a correction of the misalignment is no longer possible; the second case means that all sixteen marker lines of the set A lie within the image of the bar, i.e. a correction of the misalignment is also not possible. The signal OVR A of the value "1" appearing at the fourth output of the counter thus represents directly the overflow signal already mentioned.

Two further outputs of the output group 451 A are formed by the two outputs Q and $\bar{Q}$ of the flip-flop 462. At the output $\bar{Q}$ a signal DIR +Y of the signal value "1" appears when the flip-flop is in the reset position and the counter 461 thus set to reverse counting, i.e. during the counting of the first 8 marker lines A 15 to A 8. At the output Q a signal DIR −Y of the signal value "1" appears when the flip-flop is in the set position and the counter 462 is thus set to forwards counting, i.e. during the counting of the last 8 marker lines A 7 to A 0.

With reference to FIGS. 4a, 4b, 4c it will be explained how the misalignment counting means 460 detects the misalignment of the bar 52 in the Y direction and in the course of a single frame scanning furnishes signals which indicate directly the magnitude and direction of adjustment which is necessary to achieve the alignment position in which the lower horizontal edge of the image of the bar is disposed between the eighth marker line A 8 and the ninth marker line A 7.

If the bar 52 is in this alignment position from the start the counting means 460 counts 8 marker signals MK A 15 to MK A 8 in the course of which further white picture elements occur in the digital video signal DIGVID A. On the other hand, if in the course of the ninth marker signal MK A 7 no white picture element occurs in the digital video signal DIGVID A the counting is terminated after the eighth marker signal MK A 8 because the gating circuit 463 emits no output signals from the marker signal MK A 7 onwards. The count of the up-down counter 461 is thus reduced in eight steps to the value zero and then remains stationary on this zero count. The zero count of the up-down counter 461 indicates after completion of the counting operation that no correction is necessary in the Y-direction. In the case illustrated in FIG. 4b, in which the lower horizontal edge of the image of the bar is disposed between the third and the fourth horizontal marker lines, the counting operation is terminated after the counting of the third marker signal MK A 13. The count of the up-down counter 461 has then been reduced by three units from the initial value 8 to the value 5. The count 5 of the up-down counter 461 indicates at the end of the counting operation that for correcting the misalignment an adjustment is necessary by five marker line intervals in the Y-direction. The flip-flop 462 has remained in the reset position so that after completion of the counting operation at the output $\bar{Q}$ the signal DIR +Y is present which indicates that the adjustment must take place in the positive Y-direction.

On the other hand, in the case of FIG. 4c the counting operation is not completed until after counting of the fifteenth marker signal MK A 1. The count of the up-down counter 461 is first brought by reverse counting of the first gate marker signals MK A 15 to MK A 8 to the value zero. On reaching zero count the flip-flop 462 is set and the up-down counter 461 is then brought to the count 7 by forwards counting of the following seven marker signals MK A 7 to MK A 1. The count 7 indicates at the end of the counting operation that for the correction of the misalignment an adjustment must be made by seven marker line intervals in the Y-direction; The signal DIR-Y at the output Q of the flip-flop 462 indicates that the adjustment must take place in the negative direction.

The misalignment counting means 470 is constructed in the same manner as the misalignment counting means 460. It includes a four-stage up-down counter 471 and a flip-flop 472 which are connected in the same manner as the up-down counter 461 and the flip-flop 462. The clock input 475 of the up-down counter 471 is connected to the output of a digital gating circuit 473. At the start of each frame scanning the counter 471 is preset to the count 8 by the signal CLR and the flip-flop 472 brought to the reset position in which at the output $\bar{Q}$ there is a signal which sets the counter 471 at the control input 476 to reverse counting. On reaching the count zero a signal appears at the output 474 of the counter 471 which sets the flip-flop 472, switching the counter 471 to forwards counting.

The up-down counter 471 comprises a group of four outputs which together with the two outputs of the flip-flop 472 form the ouput group 451 B illustrated in FIG. 1. The three first outputs of this group are again the stage outputs of the last three stages of the counter so that at these three outputs a group of three binary signals BA, BB, BC appears which represent the count reached in the form of at three-bit binary number when this count is less than 8 (1000). The fourth output of the counter, which is directly the output of the counter stage associated with the highest digit value, furnishes an overflow signal OVR B when the count has reached the value 8 at the end of the counting operation. The two outputs Q and $\bar{Q}$ of the flip-flop 472 furnish signals DIR −X and DIR +X respectively which indicate whether a displacement of the bar in the negative X-direction or in the positive X-direction is necessary for the correction.

In contrast to the gating circuit 463, however, the gating circuit 473 cannot simply gate the digitized video signal DIGVID A with the marker signals MK B. For the analysis of the digitized video signal DIGVID A within each data window formed by a marker signal MK B cannot be evaluated directly for the counting because these marker signals are repeated in a larger number of successive frame lines. The analysis results obtained in each frame line must therefore be retained until complete formation of the marker lines B; only then may the marker lines B be counted in the course of which white picture elements occurred in the digital video signal DIGVID A.

For this purpose the four outputs 458 of the picture element address counter 456 are connected to four associated address inputs of a 16 bit latch 480 which also receives at a signal input the digital video signals DIGVID A, at a clear input the signal CLR and at a release input the marker signals MK B (MK B 15 to MK B 0). The 16 bit latch 480 is cleared at the start of the frames used for the marking and analysis by the pulse CLR and thereafter in the course of the frame released during the existence of a marker signal MK B for analysis of the digital video signals DIGVID A. The 16 bit latch 480 has a group of sixteen outputs which are each associated with one of the sixteen possible combinations of input signals at the four address inputs and thus one of the marker lines B 15 to B 0 or the corresponding marker signal MK B 15 to MK B 0. Thus, the output number 15 is associated with the marker line B 15, the output number 14 with the marker line B 14, etc., up to the output number 0 which is associated with the marker line B 0. If during the existence of a marker signal MK B 15 . . . MK B 0, the number of which is indicated by the binary number present at the outputs 458 of the picture element address counter 456, a white picture element occurs in the digital video signal DIGVID A the associated output of the 16 bit latch 480 assumes the condition "1" and it retains this condition until the 16 bit latch is cleared by a new clear pulse CLR. Corresponding to the formation of the marker signals MK B, in successive frame lines at the location of each marker line B 15 . . . B 0 a picture element of the digital video signal DIGVID A is thus analysed. As soon as a high signal value (white) is detected in the signal DIGVID A for the first time for the picture element corresponding to a marker line of the set B in any frame line the output of the 16 bit latch 480 associated with said marker line assumes the condition "1" and it retains this condition until the next clear pulse CLR. At the end of the complete production of the marker lines B 15 . . . B 0 the outputs of the 16 bit latch 480 which are associated with marker lines in the course of which at least one white picture element was in the digital video signal DIGVID A have assumed the condition "1" whilst the outputs associated with marker lines in the course of which no white picture element was present in the digital video signal DIGVID A have retained the condition "0".

The four outputs 458 of the picture element address counter 456 are further connected to four address inputs of an interrogation circuit which also comprises sixteen data inputs and is so designed that it furnishes at an output 482 the signal present at the data input whose number is indicated by the four-digit binary number present at the four address inputs. The sixteen data inputs of the interrogation circuit 481 are connected to the sixteen outputs of the 16 bit latch 480. The interrogation circuit 481 also has an enable output to which the signal PECT is applied so that it operates only during the existence of this signal. The interrogation 481 thus transmits in the course of each frame line in sequence to its output 482 the output signals present at the sixteen outputs of the 16 bit latch 480, this interrogation taking place in the order of formation of the marker lines B 15, B 14, . . . B 0.

The output 482 of the interrogation circuit 481 is connected to an input of the gating circuit 473. The gating circuit 473 receives at an additional control input 477 a control signal which is formed in a control circuit 478 from the signals, LN, LNX 2, PEG, PECT and B-CLK so that the gating circuit 473 is normally blocked and is released only in the frame line corresponding to the signal LNX 2 for the duration of the signal PECT. The gating circuit 473 thus processes the output signals of the interrogation circuit 481 only once in the course of a frame, that is only after completion of the formation of the complete marker lines of the set B. It furnishes at its output a signal whenever during the existence of a clock signal B-CLK a signal of the binary value "1" is present at the output 482, for as long as such output signals appear at the output 482 in uninterrupted sequence for each of the successive clock signals B-CLK. As soon as for the first time no signal "1" is present at the output 482 for a clock signal B-CLK the furnishing of further output signals is blocked by the gating circuit 473.

The first eight output signals of the gating circuit 473 are reverse counted in the up-down counter 471 until the count has reached zero, whereupon the flip-flop 472 switches over and the following output signals are counted forwards by the up-down counter 472. The counting means 470 thus indicates in the same manner as the counting means 460 at the output group 451 B directly the number of the marker lines of the set B by which the image of the bar 52 must be displaced in the X-direction to obtain the alignment position in which the right vertical edge is disposed between the eighth marker line B 8 and the ninth marker line B 7 (FIG. 4a), and the two outputs of the flip-flop 472 indicate the direction in which this displacement must be made.

If the bar 52 was in this alignment position from the start, at the instant of the evaluation the outputs number 15, number 14 . . . number 8 of the 16 bit latch 480 have assumed the condition "1" because the associated marker lines B 15 . . . B 18 lie within the image of the bar and consequently in the course of the associated marker signals MK B 15 . . . MK B 8 white picture elements have occurred in the digital video signal DIGVID A. On the other hand, the marker line B 7 is completely outside the image of the bar and, if an adjacent bar is present, completely in the intermediate space between the bars. In the course of the corresponding marker signal MK B 7 (i.e. in the short intervals of the individual pulses of said marker signal produced in the successive frame lines) no white picture elements have appeared in the digital video signal DIGVID A and accordingly the output number 7 of the 16 bit latch 480 has retained the condition "0". The remaining outputs number 6 . . . number 0 of the 16 bit latch 480 may have any conditions "0" or "1" depending on whether or not the associated marker lines B 6 . . . B 0 lie in the image of a bar; this is of no significance for the evaluation.

Thus, if the interrogation circuit 481 in the course of the frame line corresponding to the signal LNX 2 interrogates the outputs of the 16 bit latch 480 in the sequence of the addresses produced by the picture element address counter 456, i.e. starting with the output number 15, it determines in uninterrupted sequence eight outputs which carry the signal "1" whilst the ninth output interrogated carries the signal "0". Accordingly, at the output of the gating circuit 470 in succession eight pulses appear, whereupon the emission of further pulses is blocked. These eight pulses are reverse counted by the up-down counter 471 so that the count is reduced in eight steps to the value zero. The zero count of the up-down counter 471 indicates at the end of the counting operation that no adjustment is necessary in the X-direction. In the case illustrated in FIG. 4b, in which the right vertical edge of the image of the bar is disposed between the tenth marker line B 6 and the eleventh marker line B 5, at the instant of the evaluation the outputs number 15 . . . number 6 of the 16 bit latch 480 have assumed the condition "1", whilst the output number 5 carries the signal "0". Accordingly, the gating circuit 473 furnishes ten pulses at the output. By the first eight pulses the count of the up-down counter 471 is reduced to the value zero at which the flip-flop 472 is set. Thereafter, the counter 471 reaches the count 2 by forwards counting, indicating that an adjustment must be made by two marker line intervals in the X-direction. The signal DIR −X furnished by the flip-flop 472 at the output Q in the set condition indicates that the adjustment must be made in the negative X-direction.

On the other hand, in the case of FIG. 4c the output number 14 of the 16 bit latch 480 is the first output which carries the signal "0" in the course of the interrogation so that only a single pulse appears at the output of the gating circuit 473. The count of the up-down counter 471 is thus reduced by one unit from the initial value 8 to the value 7 and the flip-flop 472 remains reset. The count 7 of the up-down counter 471 indicates that an adjustment is necessary by seven marker line intervals in the X-direction and the signal DIR +X at the output $\overline{Q}$ of the flip-flop 472 indicates that the adjustment must be in the positive X-direction. FIG. 9 shows the displacement control device 14. It comprises two groups each with 6 inputs which are connected to the outputs of the misalignment counting means 460 and 470 and receive the output signals thereof. The displacement control device 14 determines on the basis of the signals DIR +Y, DIR −Y, DIR +X, DIR −X the direction of the correction displacement of the X-Y table 2 to be carried out and on the basis of the numerical values given by the signal groups A, AB, AC and BA, BB, BC generates the control signals which are applied via the output lines 15, 16 to the X motor 3 and/or the Y motor 4 and cause the latter to perform the necessary number of adjustment steps in the correct direction of rotation. At a further input the signal TOP is supplied to the displacement control device 14 and effects that said device operates only during the frame selected for the marking and analysis in each complete television picture. Furthermore, the setting device 17 for the adjustment steps JX and JY is shown.

When the displacement control device 14 receives an overflow signal OVR A or OVR B it initiates a displacement of the X-Y table 2 by the amount JX (FIG. 2) to bring the next bar into the alignment position. The machine is stopped and an alarm triggered only when an overflow signal occurs every time for a predetermined number of successive bars (for example 5). This step proves expedient because an overflow condition exists frequently only with individual bars; the number of machine stoppages can thereby be substantially reduced.

FIGS. 11, 12, 13 and 14 show an embodiment of components of the alignment sequencer 400 of FIG. 7, the misalignment detector 450 of FIG. 8 and of the marker generator 500 of FIG. 10, which embodiment is constructed with commercially available integrated TTL-circuits.

Figure 11:
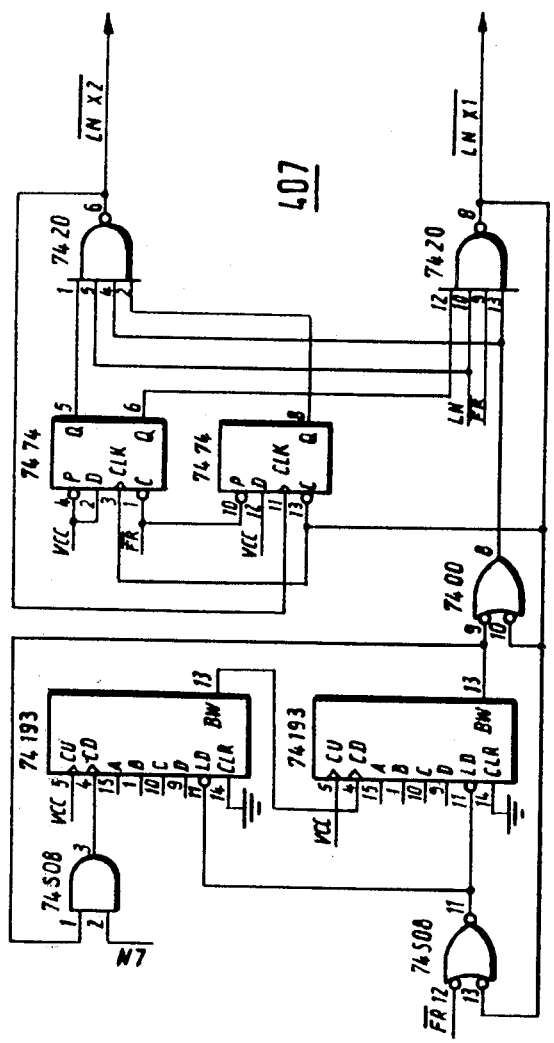
FIG. 11 is a circuit diagram of a practical embodiment of the line counter of the alignment sequencer.

FIG. 11 shows the circuit diagram of the line counter 407 of FIG. 7. It comprises two 4-bit binary counters of the type SN 74193, which are connected in series, the count down input (pin 4) of the first counter receiving the line synchronizing pulses LN via an AND gate of the type SN 74S08. The eight bits of the memory word coming from the memory 403 not shown in FIG. 11 are applied to the preset inputs (pins 15, 1, 10, 9) of the two counters. The signal supplied by the second binary counter (at pin 13) upon reaching the count of zero is used for forming the signals LNX 1 and LNX 2 in a subsequent gating circuit comprising two D-type flip-flops of the type SN 7474 and two NAND gates of the type SN 7420.

The picture element counter 408 is similarly constructed except that the input signals LN and $\overline{FR}$ of FIG. 11 are replaced by the input signals PE and $\overline{LN}$, respectively, and that instead of the output signals $\overline{LNX}$ 1 and $\overline{LNX}$ 2 of FIG. 11 the output signals $\overline{PEX}$ 1 and $\overline{PEX}$ 2, respectively, are emitted.

Figure 12:
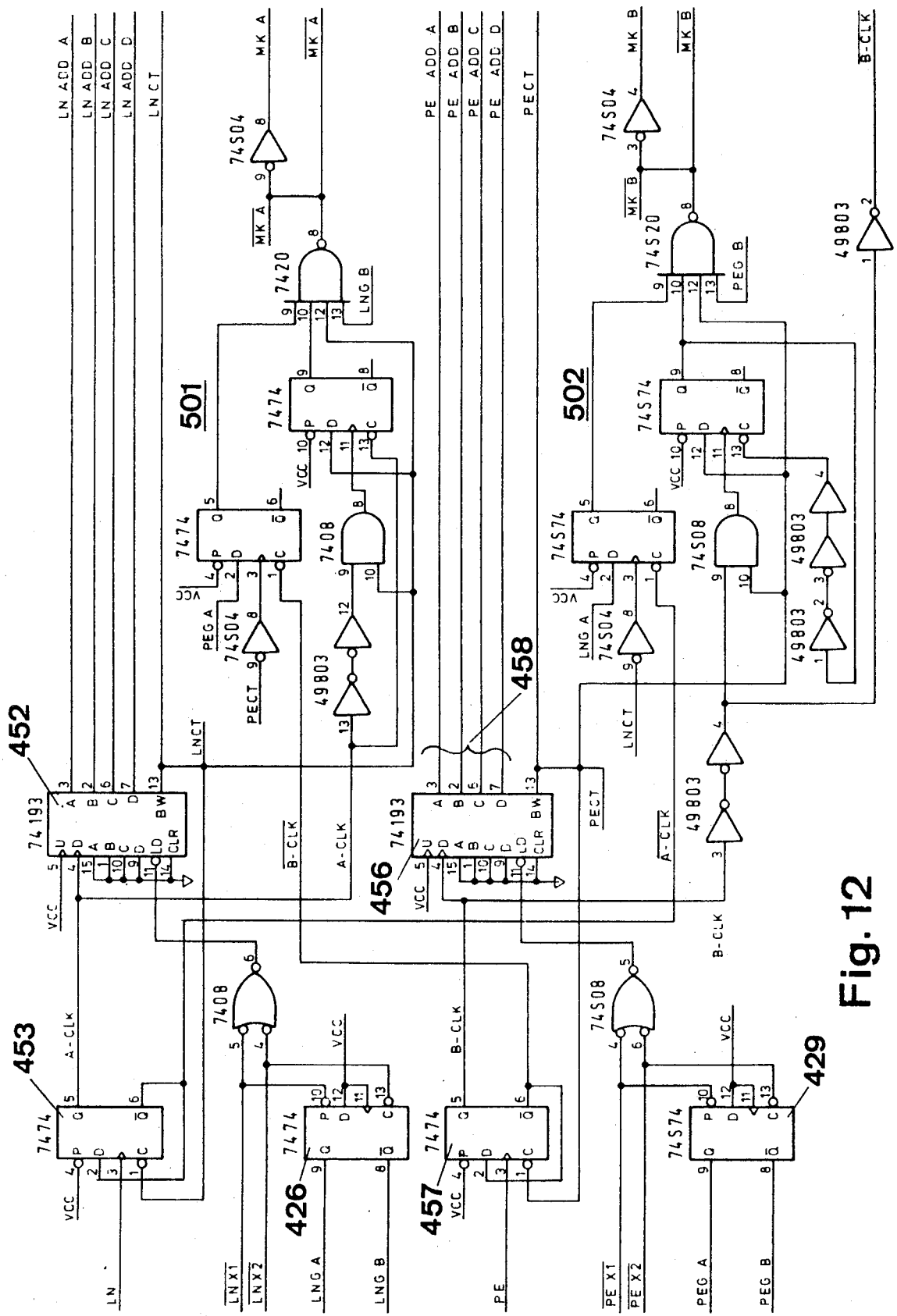
FIG. 12 is the circuit diagram of a practical embodiment of various components of the alignment sequencer, the misalignment detector and the marker generator.

The latches 426 and 429 of FIG. 7 are shown in FIG. 12; they are each formed by a D-type flip-flop of the type SN 7474 and of the type SN 74S74, respectively.

FIG. 12 further shows the line address counter 452 which is formed by a 4-bit binary counter of the type SN 74193, the count down input (pin 4) of which receives the signal A-CLK from the output of the frequency divider 453 which is formed by a D-type flip-flop of the type SN 7474, to the clock input (pin 3) of which the line synchronizing pulses LN are applied. The counter 452 receives the signal LNX 2 at its load input (pin 11), and it supplies the signal LNCT at its borrow output (pin 13). The counter stage outputs (pins 3, 2, 6, 7) of counter 452 supply four digit binary numbers indicating the addresses of the counted lines but these addresses are not used in the present case.

In like manner the picture element address counter 456 is formed by a 4-bit binary counter of the type SN 74193, the count down input (pin 4) of which receives the signal B-CLK from the output of the frequency divider 457, which again is formed by a D-type flip-flop of the type SN 7474 receiving the picture element pulses PE at the clock input (pin 3). The counter 456 receives the signal PEX 2 at its load input (pin 11). It supplies the signal PECT at its borrow output (pin 13) and the binary signals ADD A, ADD B, ADD C, ADD D at the counter stage outputs (pins, 3, 2, 6, 7).

Figure 13:
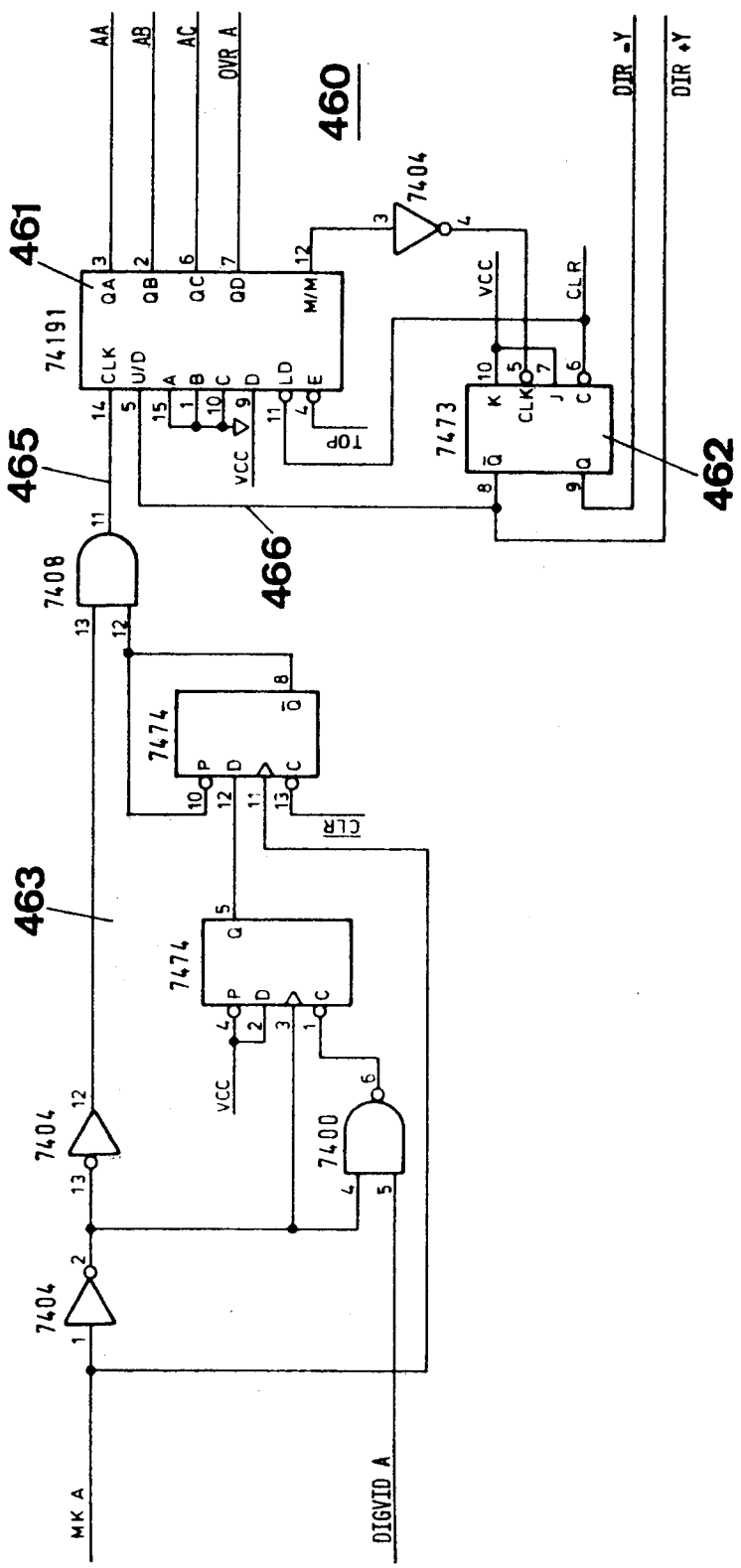
FIG. 13 is the circuit diagram of a practical embodiment of various further components of the misalignment detector.

FIG. 13 shows the misalignment counting means 460 and the associated gating circuit 463. The counter 461 is a 4-bit programmable up-down counter of the type SN 74191 receiving the output signals of the gating circuit 463 at its clock input (pin 14). The flip-flop 462 is a JK-type flip-flop of the type SN 7473, the complementary output $\overline{Q}$ (pin 8) of which is connected to the control input (pin 5) of the counter 461. The counter stage outputs (pins 3, 2, 6, 7) of the counter 461 supply the signals AA, AB, AC, OVR A, and the outputs Q, $\overline{Q}$ (pins 8, 9) of the flip-flop 462 supply the signals DIR −Y and DIR +Y.

The gating circuit 463 comprises two D-type flip-flops of the type SN 7474, a NAND gate of the type SN 7400, and AND gate of the type SN 7408 and two inverters of the type SN 7404, which gates are interconnected in the manner as shown. It receives the signals MK A and DIGVID A.

Figure 14:
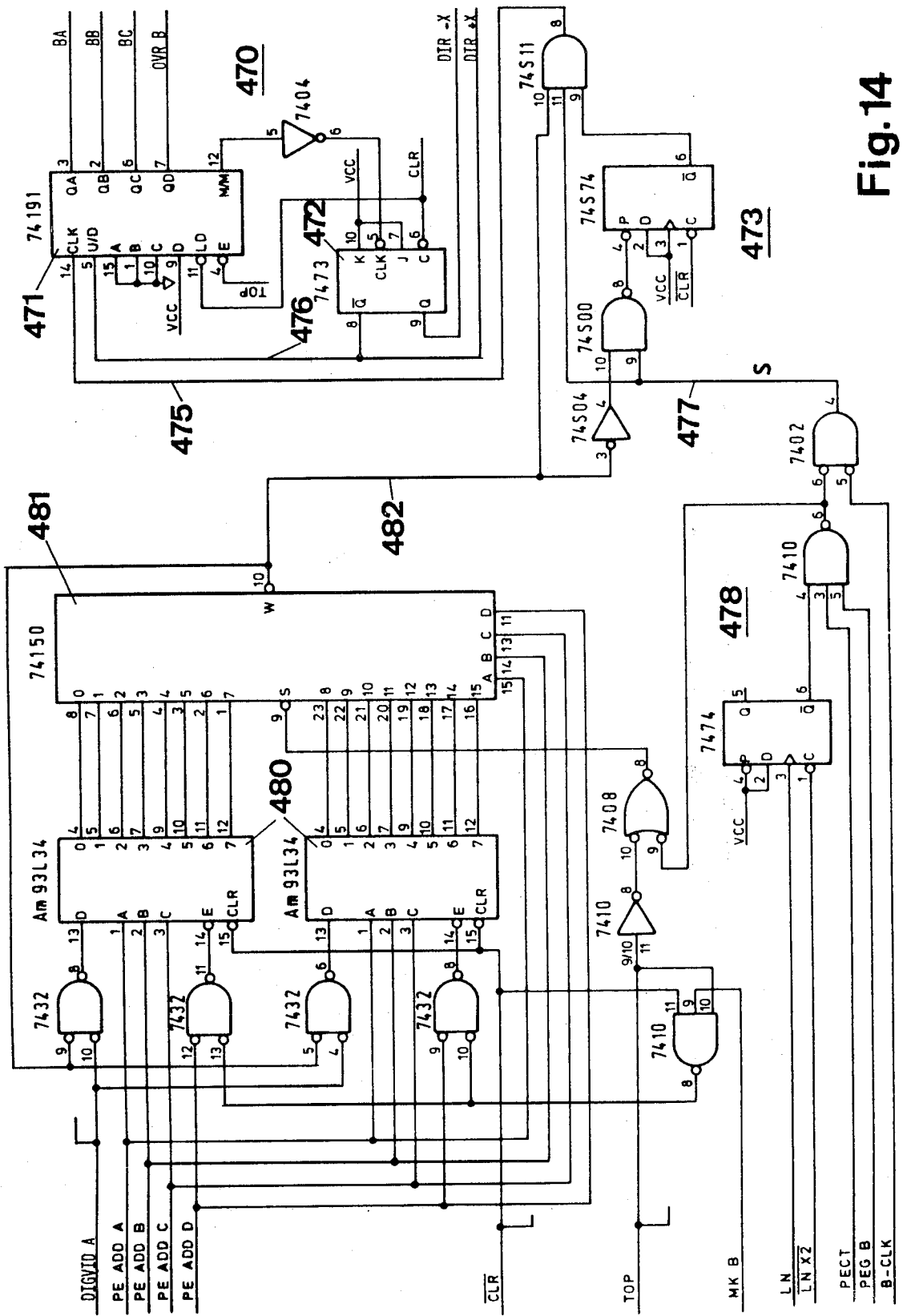
FIG. 14 is the circuit diagram of a practical embodiment of various further components of the misalignment detector.

FIG. 14 shows the misalignment counting means 470, which is constructed in the same manner as the misalignment counting means 460. The 4-bit up-down counter 471 is also of the type SN 74191, and the flip-flop 472 is a JK-type flip-flop of the type SN 7473. The clock input (pin 14) of the counter 471 receives the output signal of the gating circuit 473, and its control input (pin 5) receives the signal from the output $\overline{Q}$ (pin 8) of the flip-flop 472. The counter stage outputs (pins 3, 2, 6, 7) of the counter 471 supply the signals BA, BB, BC, OVR B, and the outputs Q, $\overline{Q}$ (pins 8,9) of the flip-flop 472 supply the signals DIR −X and DIR +X.

The gating circuit 473 in this case comprises a D-type flip-flop of the type SN 74S74, a NAND gate of the type SN 74S00, an AND gate of the type SN 74S11 and an inverter of the type SN 74S04. It receives on the one hand the output signal from the output 482 of the interrogation circuit 481 and on the other hand at its input 477 the signal S from the output of the control circuit 478.

The control circuit 478 comprises a D-type flip-flop of the type SN 7474, a NAND gate of the type SN 7410 and a NOR gate of the type SN 7402. It receives the signals LN, $\overline{LNX\,2}$, PECT, PEG B, B-CLK and generates therefrom the signal S.

The 16-bit latch 480 is formed by two addressable 8-bit latches of the type Am 93 L 34 (=SN 74259) in conjunction with a "16 to 1" multiplexer of the type SN 74150 which at the same time constitutes the interrogation circuit 481.

FIG. 12 also shows the A marker generator circuit 501 and the B marker generator circuit 502 of the marker generator 500 (FIG. 10). The A marker generator circuit 501 comprises two D-type flip-flops of the type SN 7474 with the associated input circuitry and a NAND gate of the type SN 7420, which receives the output signals of the two flip-flops as well as the signals LNCT and LNG B and supplies the marker signals MK A via an inverter of the type SN 74S04. The B marker generator circuit 502 also comprises two D-type flip-flops of the type SN 74S74 and a NAND gate of the type SN 74S20 which receives the signals PECT and PEG B in addition to the output signals of the two flip-flops and which supplies the marker signals MK B via an inverter of the type SN 74S04.

Different modifications of the described embodiment are possible without impairing the function. Thus, the number of sixteen marker lines in each set only constitutes an example; it is possible to use more or less marker lines depending on the desired range of alignment.

Moreover, it is not absolutely necessary that all distances between the marker lines of each set are of equal size. In particular, it can be advantageous to make the distance between the two marker lines lying on both sides of the edge of the image of the object in the aligned position greater than the distances between the remaining marker lines. In the embodiment described above, this would be the distance between the marker lines A 8 and A 7 of set A and between the marker lines B 8 and B 7 of set B. In this manner one obtains a somewhat greater range of tolerance in the aligned position.

In the described embodiment one presupposes that each data window lies within the image of the object, if there is at least one white picture element ascertained in the digital video signal in the course of this data window. This condition, too, is not absolutely necessary; it would be possible to fix a threshold value, so that only the white picture elements in each data window are counted which exceed a predetermined minimum number.

It would also be possible to use the left and/or the upper edge of the image of the object instead of the lower and the right edge for the alignment. The use of the lower and the right edge, however, results in the advantage that the marker lines are counted from inside out relative to the image of the object in the same order as they are produced in the video image, that is the horizontal marker lines are counted from the top downwards (direction of the frame scanning) and the vertical marker lines are counted from left to right (direction of the line scanning).

What is claimed is:

1. Apparatus for aligning with respect to a known reference position an object disposed in the field of view of a television camera on a carrier adjustable in X and Y axial directions, the television camera scanning a surface of the object and a peripheral area surrounding the object in a line raster and generating electrical video signals which correspond to an image of the scanned area, comprising digitizing means for which receiving the video signals and forming therefrom digital video signals of two signal levels which for the video signals originating from the object have predominantly a first signal level and for the video signals originating from the peripheral area have the second level, analyzing means (a) for analyzing the digital video signals in two sets of data windows, each set associated with an individual one of the X and Y axial direction and in each set, the data windows corresponding to separate regions of the video image having in the associated axial direction predetermined distances from each other and different distances from an associated edge of the image of the object, and (b) for responding to the appearance of digital video signals of the first signal level in each data window and furnishing output signals for each data window set depending on the number of data windows counted in uninterrupted sequence in a predetermined sense in the associated axial direction, and during which the proportion of digital video signals of the first signal level exceeds a predetermined minimum value, wherein a single data window set is provided for each axial direction, and in that and wherein each data window set the number of data windows counted in uninterrupted sequence in said predetermined sense in the respective axial direction and having a proportion of digital video signals of the first signal level exceeding said predetermined minimum value is equal to a predetermined number (N) different from zero when said object is aligned with respect to said reference position.

2. Apparatus according to claim 1, including control means for effecting displacement of the carrier by an amount and in a direction dependent upon the output signals of said analyzing means.

3. Apparatus according to claim 2, wherein the control means is for effecting displacement of the carrier in each axial direction by an amount and in a direction corresponding to the difference between the predetermined number different from zero and the number of data windows of the corresponding data window set counted in uninterrupted sequence in said predetermined sense in this axial direction and having a proportion of digital video signals of the first signal level exceeding the predetermined minimum value.

4. Apparatus according to claim 3, characterized by monitor means for rendering visible the video image which is represented by the video signals generated by the television camera.

5. Apparatus according to claim 1, wherein the predetermined minimum value of the proportion at the first signal level in the digital video signal corresponds to this signal level being reached once.

6. Apparatus according to claim 1, wherein the data window sets correspond to video image areas which lie at the lower edge and at the right edge respectively of the video image of the object.

7. Apparatus according to claim 1, for use in the alignment of objects disposed at spaced intervals adjacent each other on the carrier, wherein the separation between the video image regions corresponding to the data windows of each data window set is smaller than the space between the video images of two adjacent objects so that in each position of the object to be aligned at least one data window video image region lies completely in said space.

8. Apparatus according to claim 1, wherein the data windows of each data window set correspond to video image regions in the form of parallel lines.

9. Apparatus according to claim 8, characterized by generator circuit means for generating marker signals for application as data windows to the analyzing means and for superposing on the video signals generated by the television camera to represent marker lines which correspond to the parallel lines.

10. Apparatus according to claim 9, wherein the generator circuits are operable for generating (a) a first set of marker signals which extend in each case over equal portions of television lines and correspond to the representation of horizontal marker lines in the video image, and (b) a second set of marker signals which contain in a portion of each television line spaced pulses and correspond to the representation of vertical marker lines extending perpendicularly to the television lines in the video image.

11. Apparatus according to claim 9, wherein with a television camera operating with line interlacing the marker signal sets are generated only in a selected frame of each complete television image.

12. Apparatus according to claim 9, including sync separator means for receiving output signals of the television camera and furnishes at two separate outputs frame synchronizing pulses and line synchronizing pulses, a pulse generator means for synchronization by the line synchronizing pulses in such a manner that in the course of the scanning of each television line it furnishes a sequence of picture element pulses, the frequency of which is large compared with the line frequency and which have defined time locations with respect to the corresponding line synchronizing pulse, and alignment sequencer means for receiving the frame synchronizing pulses, the line synchronizing pulses and the picture element pulses and in which numerical values may be set which designate the location and extent of the data windows and for counting line synchronizing pulses and picture element pulses to generate control signals which have predetermined time locations and extents in each frame or in each frame line according to the numerical values set.

13. Apparatus according to claim 12, including a misalignment detector means for receiving the control signals, the marker signals and the digital video signals and including for each marker signal set an analyzing circuit which is cleared for the analysis of the digital video signals by the marker signals of the associated marker signals.

14. Apparatus according to claim 13, wherein the misalignment detector means comprises for each marker signal set misalignment counter means for responding on the basis of the signals obtained by the analysis of the digital video signals to assume a count which depends on the number of the marker signals counted in uninterrupted sequence in the predetermined sense in the corresponding marker signal set during which the proportion of the first signal level in the digital video signals exceeds the predetermined minimum value.

15. Apparatus according to claim 14, wherein each misalignment counter means is constructed for furnishing at its outputs digital signals which indicate the amount and the sign of the difference between the predetermined number and the number of the counted marker signals.

16. Apparatus according to claim 15, wherein each misalignment counter means comprises an up-down counter, means for setting the up-down counter before the start of each analysis to a count corresponding to the predetermined number and to reverse counting, and a count direction control circuit means for responding to the count zero to switch the up-down counter from reverse counting to forward counting.

17. Apparatus according to claim 16, wherein the count direction control circuit is formed by a flip-flop having a switch control input connected to an output of the up-down counter in such a manner that the flip-flop is switched when the count zero is reached, and the flip-flop having an output connected to an input of the up-down counter defining the count direction.

18. Apparatus according to claim 17, wherein the signals appearing at the outputs of the flip-flop are used to indicate the sign of the difference.

19. Apparatus according to claim 16, wherein the up-down counter is a multi-stage binary counter and the signals appearing at the outputs of stages of the binary counter are indicative of the amount of the difference.

20. Apparatus according to claim 19, wherein a signal appearing at the output of a further stage of the binary counter is used to indicate an overflow condition not permitting alignment.

21. Apparatus according to claim 15 wherein, the count signal input of the up-down counter of each misalignment counter means is connected to the output of a gating circuit means for furnishing one and only one output signal for each marker signal of the associated marker signal set in the course of which the proportion of the first signal level in the digital video signal exceeds the predetermined minimum value and for blocking the furnishing of further output signals when in the course of a marker signal the predetermined proportion of the first signal level in the digital signal has not been reached.

22. Apparatus according to claim 21, wherein the gating circuit of the analyzing circuit which is provided for the analysis of the marker signals corresponding to the horizontal marker lines is connected to receive at one input the digital video signals and at another input the marker signals.

23. Apparatus according to claim 21, wherein the analyzing circuit analyzing the marker signals corresponding to the vertical marker lines comprises a latch which comprises a latch stage for each marker signal corresponding to a marker line which is brought into a predetermined condition when the proportion of the first signal level in the digital video signal during the presence of said marker signal exceeds the predetermined minimum value, and evaluating circuit means for evaluating the conditions of the latch stages existing at the end of the complete formation of the marker signals of the respective marker signal set.

24. Apparatus according to claim 23, wherein associated with the latch is interrogation circuit means for interrogating the outputs of the latch stages for the presence of the predetermined condition, said interrogation circuit means having an output connected to the input of the gating circuit.

25. Apparatus according to claim 24, including a control circuit means for generating a control signal which in the course of the last television line in which the marker signals of the respective marker signals set are generated is present for the duration of said marker signals, said control circuit means having an output for furnishing the control signal connected to a control input of the gating circuit.

26. Apparatus according to claim 24, including picture element address counter means for advancement in time with the marker signals corresponding to the vertical marker lines in the course of each frame line and for generating a set of output signals which represent the number of each vertical marker line and means for applying said output signals to address inputs of the latch and the interrogation circuit.

* * * * *